United States Patent
Chen et al.

(10) Patent No.: US 12,125,877 B2
(45) Date of Patent: *Oct. 22, 2024

(54) NANOSTRUCTURE FIELD-EFFECT TRANSISTOR DEVICE WITH DIELECTRIC LAYER FOR REDUCING SUBSTRATE LEAKAGE OR WELL ISOLATION LEAKAGE AND METHODS OF FORMING

(71) Applicant: Taiwan Semiconductor Manufacturing Co., Ltd., Hsinchu (TW)

(72) Inventors: Guan-Lin Chen, Baoshan Township (TW); Kuo-Cheng Chiang, Zhubei (TW); Shi Ning Ju, Hsinchu (TW); Jung-Chien Cheng, Tainan (TW); Chih-Hao Wang, Baoshan Township (TW); Kuan-Lun Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/306,629

(22) Filed: Apr. 25, 2023

(65) Prior Publication Data

US 2023/0290687 A1 Sep. 14, 2023

Related U.S. Application Data

(63) Continuation of application No. 17/226,599, filed on Apr. 9, 2021, now Pat. No. 11,670,550.

(Continued)

(51) Int. Cl.
*H01L 29/06* (2006.01)
*H01L 21/8234* (2006.01)
(Continued)

(52) U.S. Cl.
CPC .. *H01L 29/0665* (2013.01); *H01L 21/823418* (2013.01); *H01L 29/0653* (2013.01);
(Continued)

(58) Field of Classification Search
CPC ........... H01L 29/42392; H01L 29/0653; H01L 29/0665; H01L 21/823418;
(Continued)

(56) References Cited

U.S. PATENT DOCUMENTS 9,209,247 B2  12/2015  Colinge et al.
9,224,833 B2  12/2015  Chen et al.
(Continued)

FOREIGN PATENT DOCUMENTS

KR  20080048434 A   6/2008
KR  20180115392 A  10/2018
(Continued)

*Primary Examiner* — Changhyun Yi
(74) *Attorney, Agent, or Firm* — Slater Matsil, LLP

(57) ABSTRACT

A method of forming a semiconductor device includes: forming a fin structure protruding above a substrate, where the fin structure comprises a fin and a layer stack overlying the fin, where the layer stack comprises alternating layers of a first semiconductor material and a second semiconductor material; forming a dummy gate structure over the fin structure; forming openings in the fin structure on opposing sides of the dummy gate structure, where the openings extend through the layer stack into the fin; forming a dielectric layer in bottom portions of the openings; and (Continued)

forming source/drain regions in the openings on the dielectric layer, where the source/drain regions are separated from the fin by the dielectric layer.

20 Claims, 38 Drawing Sheets

Related U.S. Application Data

(60) Provisional application No. 63/139,974, filed on Jan. 21, 2021.

(51) Int. Cl.
*H01L 29/423* (2006.01)
*H01L 29/66* (2006.01)
*H01L 29/786* (2006.01)

(52) U.S. Cl.
CPC .. *H01L 29/42392* (2013.01); *H01L 29/66545* (2013.01); *H01L 29/78696* (2013.01)

(58) Field of Classification Search
CPC ......... H01L 29/66545; H01L 29/78696; H01L 21/823807; H01L 29/1079; H01L 21/823814

See application file for complete search history.

(56) References Cited

U.S. PATENT DOCUMENTS

| | | |
|---|---|---|
| 9,251,888 B1 | 2/2016 | Liaw |
| 9,805,988 B1 | 10/2017 | Bentley et al. |
| 10,923,598 B2 | 2/2021 | Wang et al. |
| 11,387,367 B2 | 7/2022 | Shin et al. |
| 11,670,550 B2 * | 6/2023 | Chen ................ H01L 29/66439 257/401 |
| 2008/0124946 A1 | 5/2008 | Xiao et al. |
| 2015/0048442 A1 | 2/2015 | Colinge et al. |
| 2015/0303270 A1 | 10/2015 | Liaw |
| 2018/0301564 A1 | 10/2018 | Kwon et al. |
| 2020/0044060 A1 | 2/2020 | Cheng et al. |
| 2020/0083219 A1 | 3/2020 | Kang et al. |
| 2020/0303500 A1 | 9/2020 | Loubet et al. |

FOREIGN PATENT DOCUMENTS

| | | |
|---|---|---|
| KR | 20200014235 A | 2/2020 |
| TW | 202036662 A | 10/2020 |

* cited by examiner

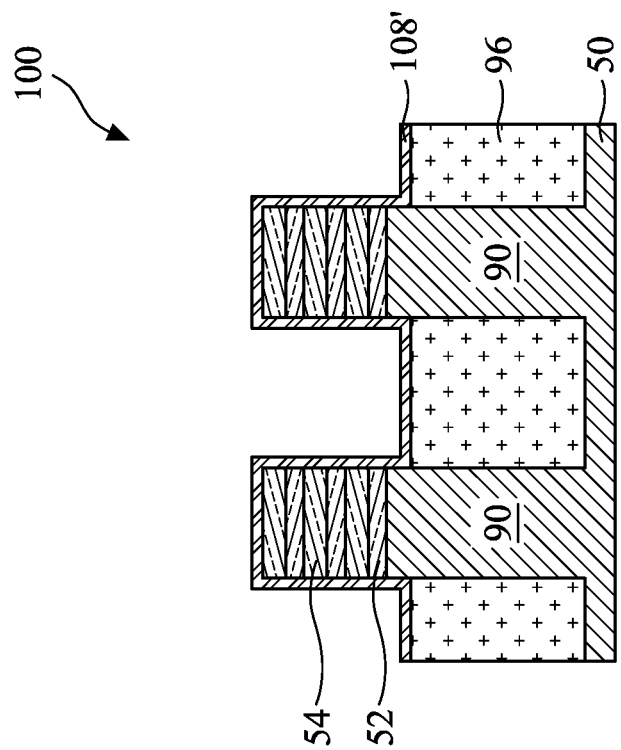
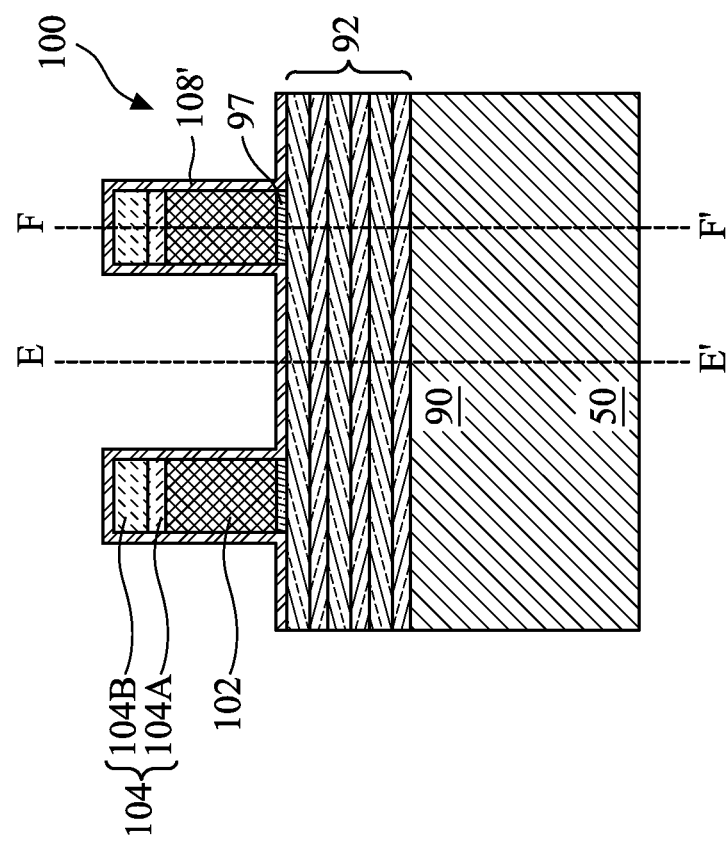
Figure 5B
Figure 5A

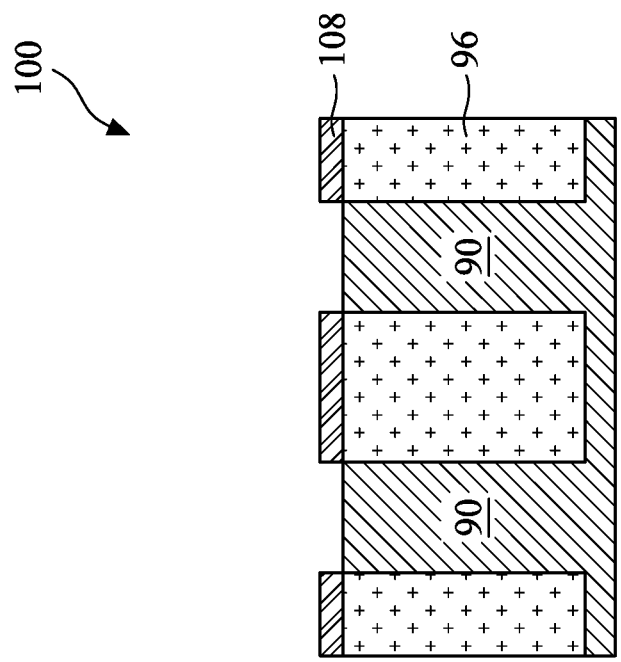
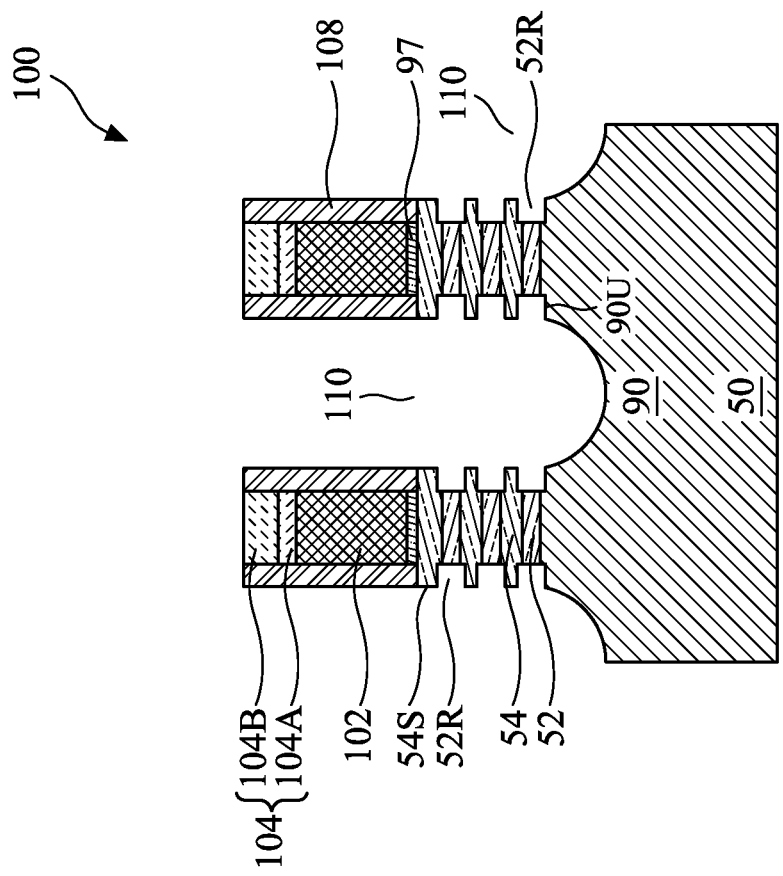
Figure 6A
Figure 6B

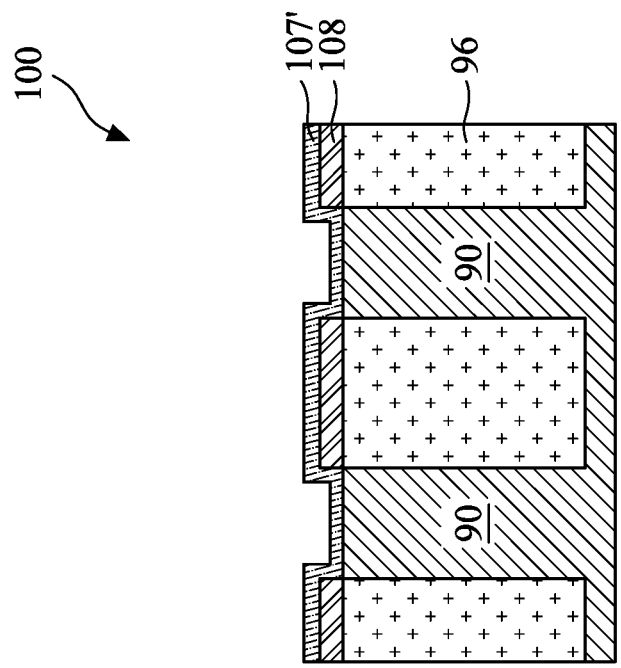
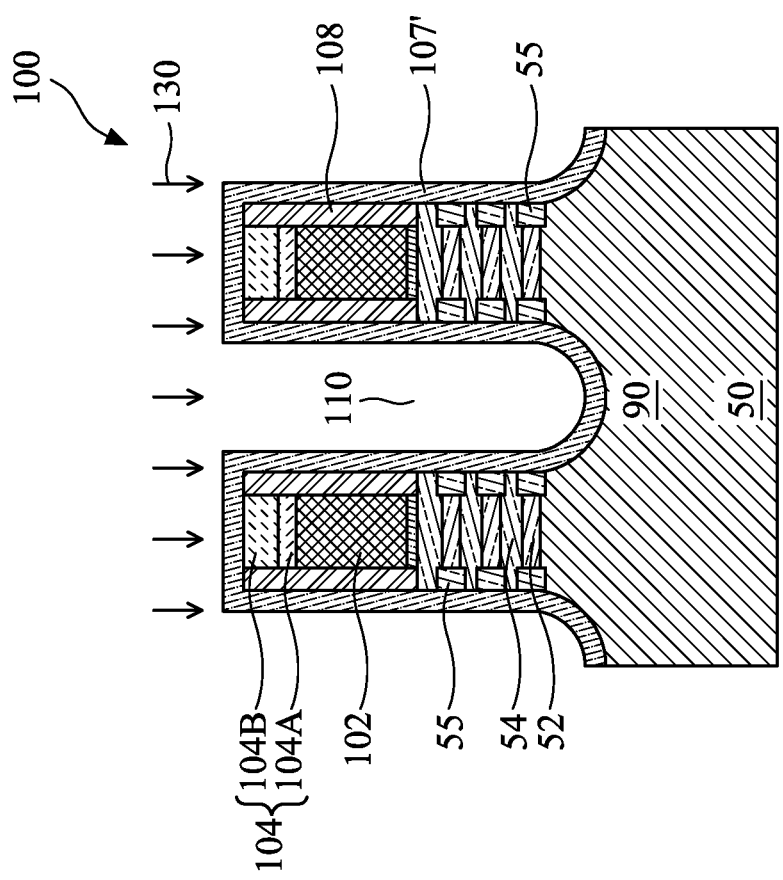
Figure 9B
Figure 9A

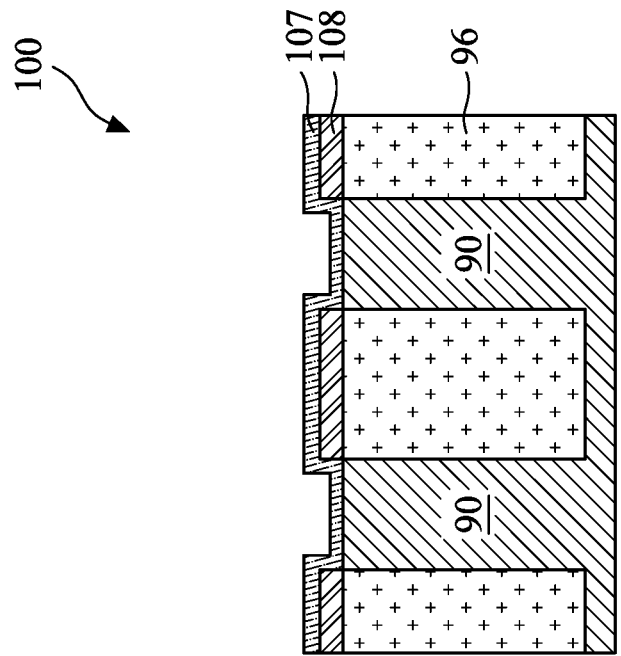
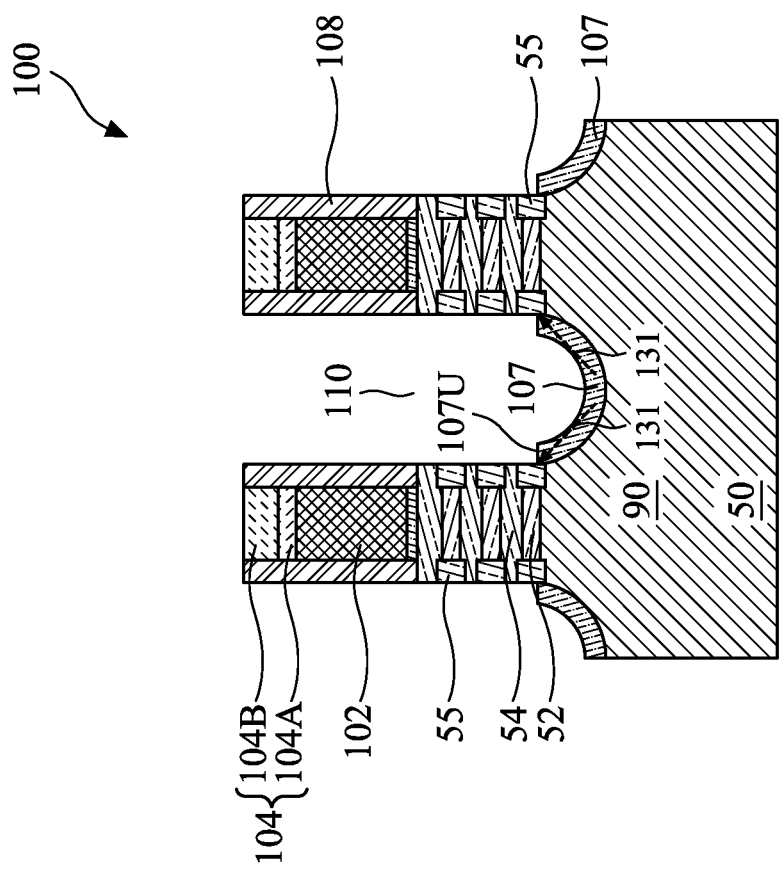
Figure 10B
Figure 10A

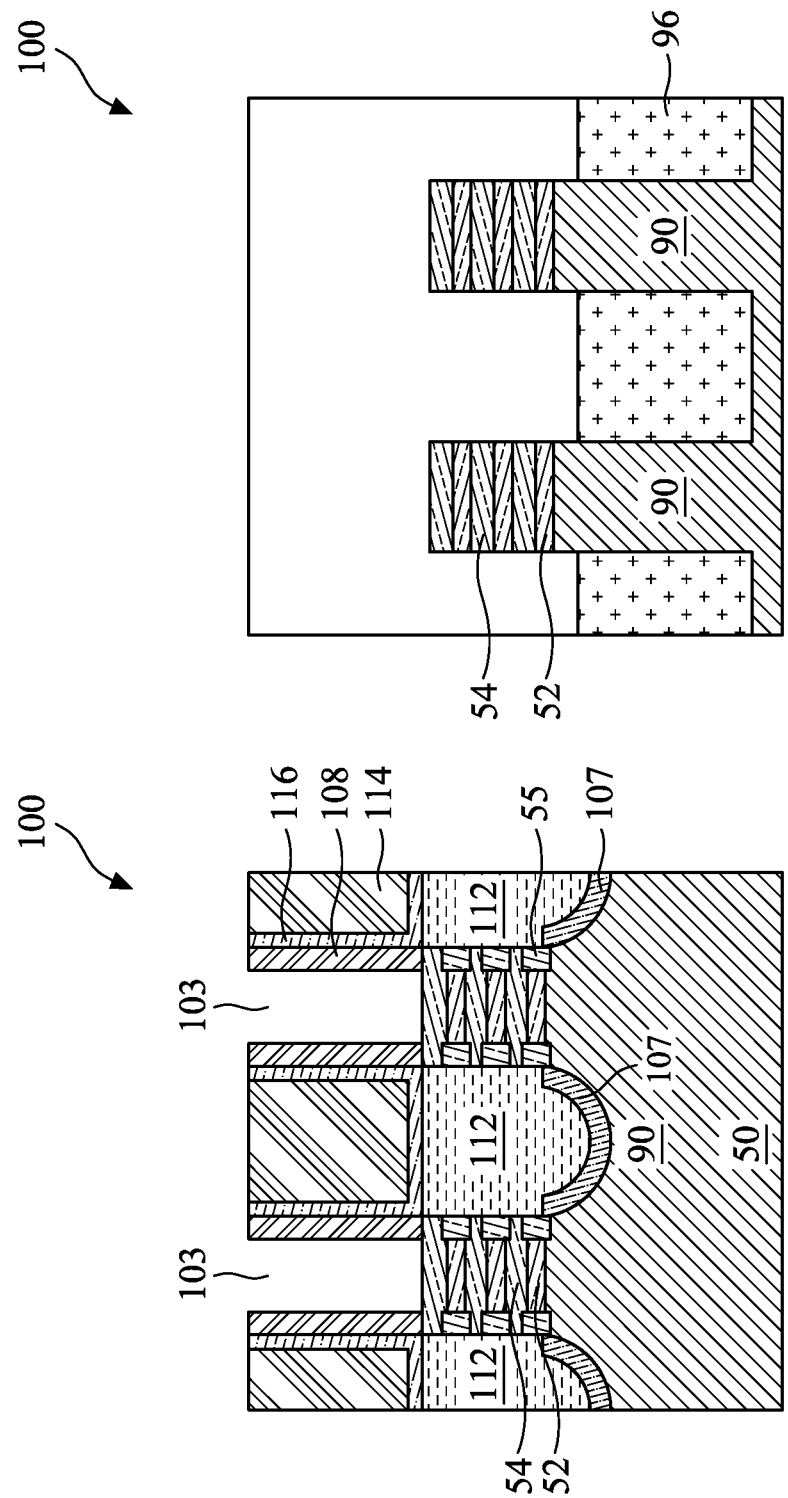

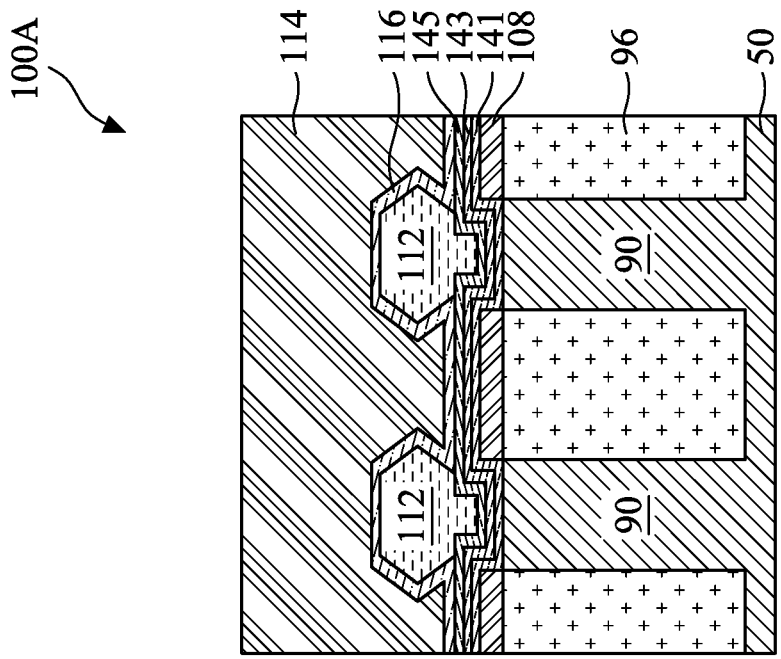
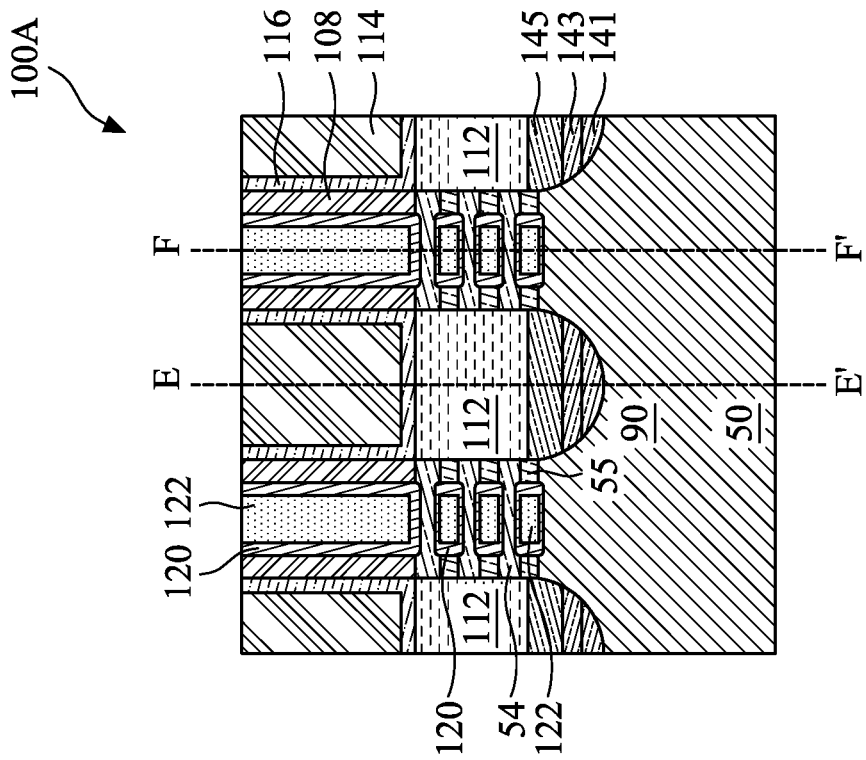
Figure 19A
Figure 19B

NANOSTRUCTURE FIELD-EFFECT TRANSISTOR DEVICE WITH DIELECTRIC LAYER FOR REDUCING SUBSTRATE LEAKAGE OR WELL ISOLATION LEAKAGE AND METHODS OF FORMING

PRIORITY CLAIM AND CROSS-REFERENCE

This application is a continuation of U.S. application Ser. No. 17/226,599, filed on Apr. 9, 2021 and titled "Nanostructure Field-Effect Transistor Device and Method of Forming," which claims the benefit of U.S. Provisional Application No. 63/139,974, filed on Jan. 21, 2021 and entitled "Novel Method to Suppress Bulk Substrate Leakage and Well Isolation Leakage," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional challenges arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A, 5B, 5C, 6A, 6B, 6C, 7A, 7B, 7C, 8A, 8B, 8C, 9A, 9B, 9C, 10A, 10B. 10C, 11A, 11B, 11C, 12A, 12B, 12C, 13A, 13B, 14A, 14B, 15A, 15B, 16A, and 16B are cross-sectional views of a nanostructure field-effect transistor (NSFET) device at various stages of manufacturing, in accordance with an embodiment.

FIGS. 17, 18, 19A, 19B, and 19C are cross-sectional views of a nanostructure field-effect transistor device at various stages of manufacturing, in accordance with another embodiment.

DETAILED DESCRIPTION

Figure 1:
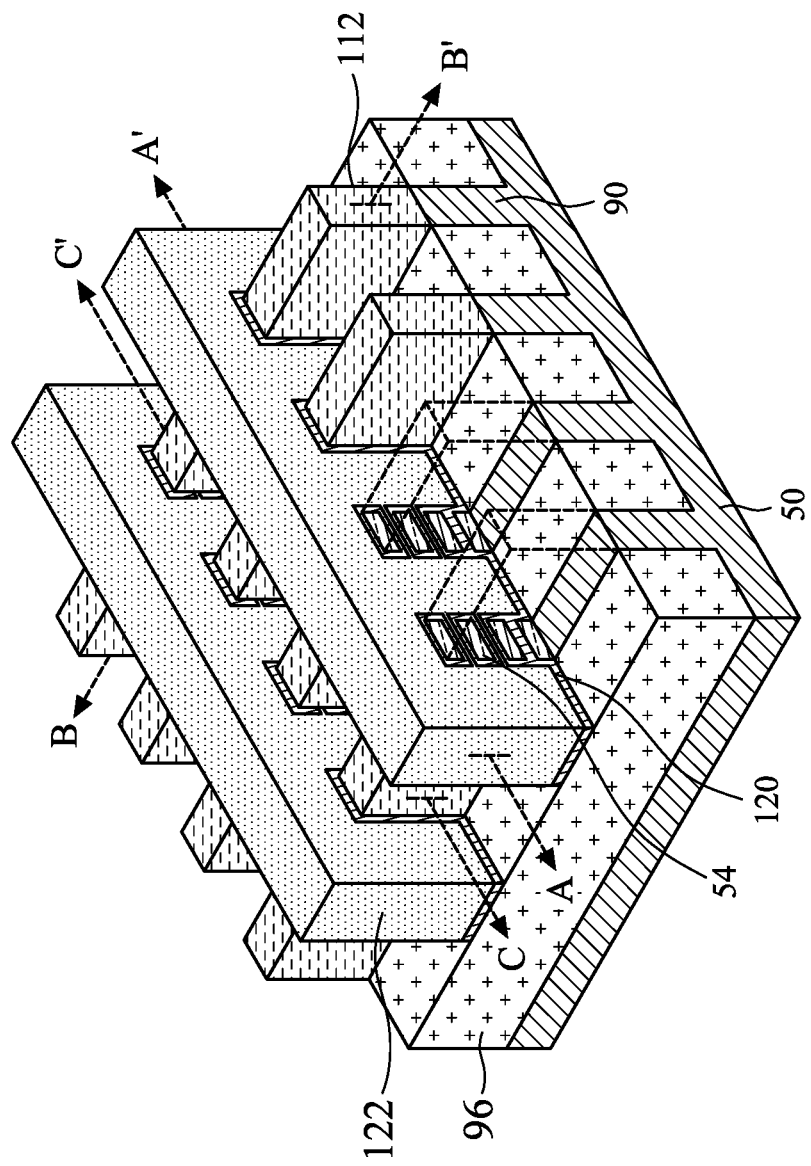
FIG. 1 illustrates an example of a nanostructure field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, the same reference numeral in different figures refers to the same or similar element formed by a same or similar formation method using a same or similar material(s). In addition, figures with the same numeral but different alphabets (e.g., FIGS. 5A, 5B, and 5C) illustrate the same semiconductor device at the same stage of manufacturing, but along different cross-sections.

In accordance with some embodiments, a dielectric layer is formed under the source/drain regions located in a short channel device region of an n-type device region of a nanostructure field-effect transistor (NSFET) device. The dielectric layer physically separates, and electrically isolates, the source/drain regions from the underlying fins, thereby reducing or preventing substrate leakage and/or well isolation leakage. In some embodiments, the dielectric layer is formed only under the source/drain regions of the short channel device region in the n-type device region of the NSFET device. The dielectric layer is not formed in the p-type device region of the NSFET device, nor is the dielectric layer formed in a large channel device region or a pick-up region of the n-type device region.

FIG. 1 illustrates an example of a nanostructure field-effect transistor (NSFET) device in a three-dimensional view, in accordance with some embodiments. The NSFET device comprises semiconductor fins 90 (also referred to as fins) protruding above a substrate 50. Gate electrodes 122 (e.g., metal gates) are disposed over the fins, and source/drain regions 112 are formed on opposing sides of the gate electrodes 122. A plurality of nanosheets 54 are formed over the fins 90 and between source/drain regions 112. Isolation regions 96 are formed on opposing sides of the fins 90. A gate dielectric layer 120 is formed around the nanosheets 54. Gate electrodes 122 are over and around the gate dielectric layer 120.

FIG. 1 further illustrates reference cross-sections that are used in later figures. Cross-section A-A' is along a longitudinal axis of a gate electrode 122 and in a direction, for example, perpendicular to the direction of current flow between the source/drain regions 112 of an NSFET device. Cross-section B-B' is perpendicular to cross-section A-A' and is along a longitudinal axis of a fin and in a direction of, for example, a current flow between the source/drain regions 112 of the NSFET device. Cross-section C-C' is parallel to the cross-section A-A' and extends through the source/drain regions 112. Subsequent figures refer to these reference cross-sections for clarity.

FIGS. 2, 3A, 3B, 4A, 4B, 5A-5C, 6A-6C, 7A-7C, 8A-8C, 9A-9C, 10A-10C, 11A-11C, 12A-12C, 13A, 13B, 14A, 14B, 15A, 15B, 16A, and 16B are cross-sectional views of a nanostructure field-effect transistor (NSFET) device 100 at various stages of manufacturing, in accordance with an embodiment.

Figure 2:
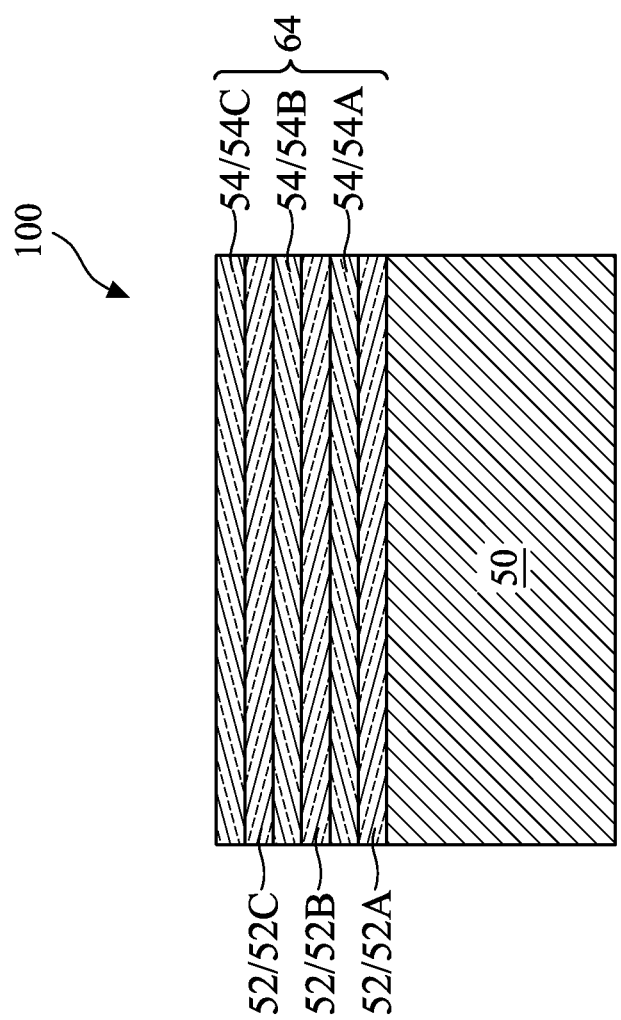

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first semiconductor material 52 and the second semiconductor material 54 illustrated in FIG. 2 is merely a non-limiting example. Other numbers of layers are also possible and are fully intended to be included within the scope of the present disclosure.

In some embodiments, the first semiconductor material 52 is an epitaxial material suitable for forming channel regions of, e.g., p-type FETs, such as silicon germanium ($Si_xGe_{1-x}$, where x can be in the range of 0 to 1), and the second semiconductor material 54 is an epitaxial material suitable for forming channel regions of, e.g., n-type FETs, such as silicon. The multi-layer stacks 64 (may also be referred to as an epitaxial material stack) will be patterned to form channel regions of NSFETs in subsequent processing. In particular, the multi-layer stacks 64 will be patterned to form horizontal nanostructures (e.g., nanosheets or nanowires), with the channel regions of the resulting NSFETs including multiple horizontal nanostructures.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target number of layers are formed.

FIGS. 3A, 3B, 4A, 4B, 5A-5C, 6A-6C, 7A-7C, 8A-8C, 9A-9C, 10A-10C, 11A-11C, 12A-12C, 13A, 13B, 14A, 14B, 15A, 15B, 16A, and 16B are cross-sectional views of the NSFET device 100 at subsequent stages of manufacturing, in accordance with an embodiment. FIGS. 3A, 4A, 5A, 6A, 7A, 8A, 9A, 10A, 11A, 12A, 13A, 14A, 15A, 16A, and 16B are cross-sectional views along cross-section B-B' in FIG. 1. FIGS. 5B, 6B, 7B, 8B, 9B, 10B, 11B, and 12B are cross-sectional views along cross-section C-C' in FIG. 1. FIGS. 3B, 4B, 5C, 6C, 7C, 8C, 9C, 10C, 11C, 12C, 13B, 14B, and 15B are cross-sectional views along cross-section A-A' in FIG. 1. The number of fins and the number of gate structures illustrated in the figures are non-limiting examples, and it should be appreciated that other numbers of fins and other numbers of gate structures may also be formed. For simplicity, FIGS. 3A, 3B, 4A, 4B, 5A-5C, 6A-6C, 7A-7C, 8A-8C, 9A-9C, 10A-10c, 11A-11C, 12A-12C, 13A, 13B, 14A, 14B, 15A, and 15B illustrate the processing steps to form n-type NSFETs in an n-type device region of the NSFET device 100. The same or similar processing steps may be performed to form p-type NSFETs in a p-type device region of the NSFET device 100, as one skilled in the art readily appreciates. FIG. 16A illustrates NSFETs formed in an n-type device region of the NSFET device 100, and FIG. 16B illustrates NSFETs formed in a p-type device region of the NSFET device 100.

Figures 3A, 3B:
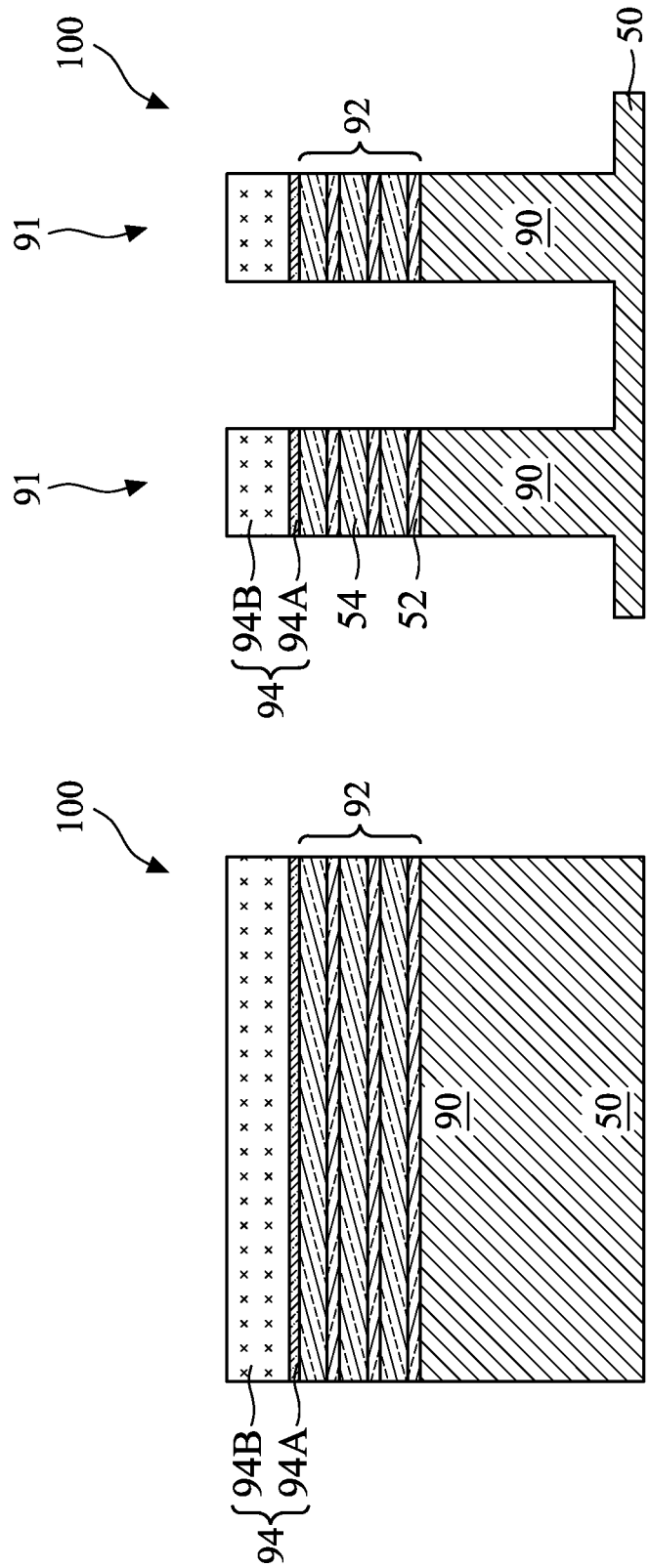

In FIGS. 3A and 3B, fin structures 91 are formed protruding above the substrate 50. Each of the fin structures 91 includes a semiconductor fin 90 and a layer stack 92 overlying the semiconductor fin 90. The layer stack 92 and the semiconductor fin 90 may be formed by etching trenches in the multi-layer stack 64 and the substrate 50, respectively.

The fin structure 91 may be patterned by any suitable method. For example, the fin structure 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 91.

In some embodiments, the remaining spacers are used to pattern a mask 94, which is then used to pattern the fin structure 91.

The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the layer stacks 92, and the patterned substrate 50 form the semiconductor fins 90, as illustrated in FIGS. 3A and 3B. Therefore, in the illustrated embodiment, the layer stack 92 also includes alternating layers of the first semiconductor material 52 and the second semiconductor material 54, and the semiconductor fin 90 is formed of a same material (e.g., silicon) as the substrate 50.

Figure 4B:
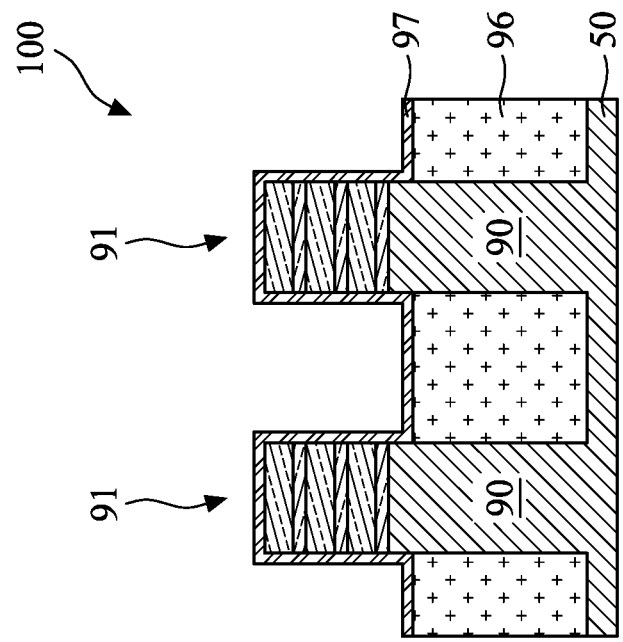
Figure 4A:
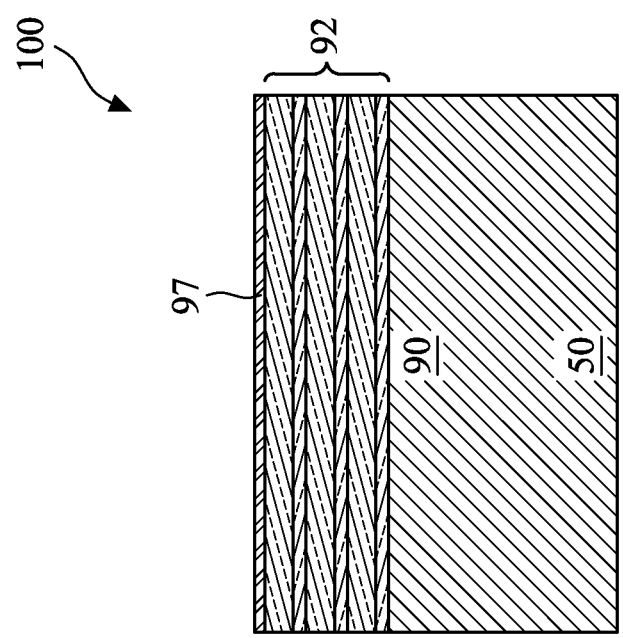

Next, in FIGS. 4A and 4B, Shallow Trench Isolation (STI) regions 96 are formed over the substrate 50 and on opposing sides of the fin structure 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 91. In some embodiments, a liner is first formed along surfaces of the substrate 50 and fin structure 91, and a fill material, such as those discussed above is formed over the liner. In some embodiments, the liner is omitted.

Next, a removal process is applied to the insulation material to remove excess insulation material from over the fin structure 91. In some embodiments, a planarization process such as a chemical mechanical polish (CMP), an etch back process, combinations thereof, or the like, may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the layer stacks 92). For example, a chemical oxide removal with a suitable etchant such as dilute hydrofluoric (dHF) acid may be used.

Still referring to FIGS. 4A and 4B, a dummy dielectric layer 97 is formed over the layer stacks 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stacks 92 and over the upper surface of the STI regions 96, and a thermal oxidization process is performed to convert the deposited silicon layer into an oxide layer as the dummy dielectric layer 97.

Figure 5C:
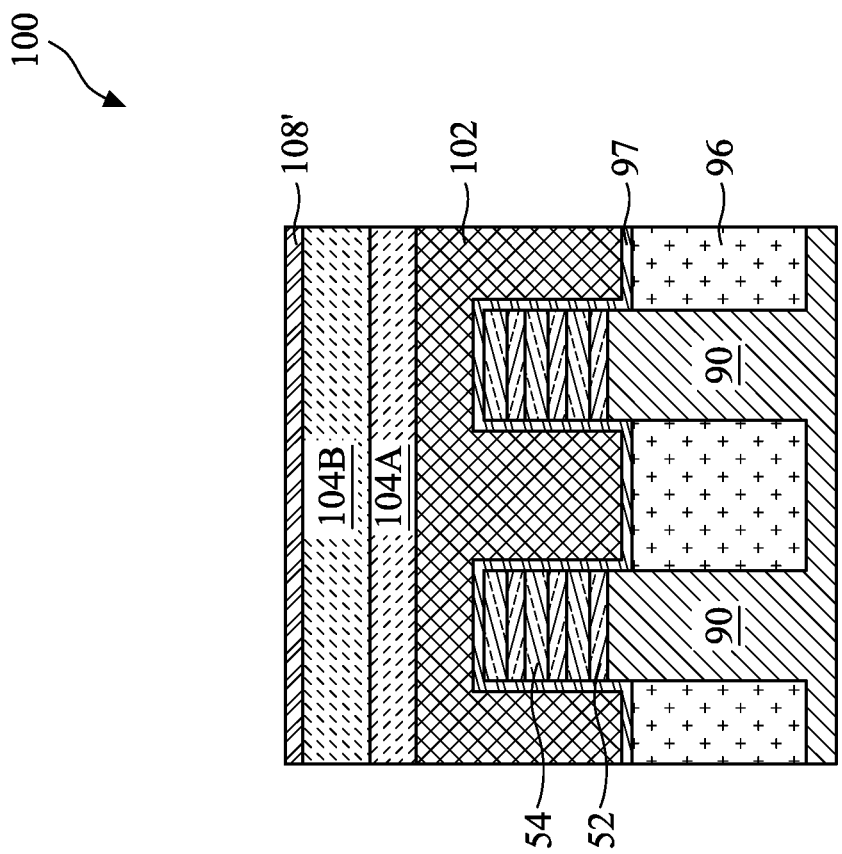

Next, in FIGS. 5A-5C, dummy gates 102 are formed over the fins 90 and over the layer stacks 92. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (poly-silicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the STI regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the layer stack 92. The pattern of the masks 104 may be used to physically separate each of the dummy gates 102 from adjacent dummy gates. The dummy gate 102 may also have a lengthwise direction substantially perpendicular to the lengthwise direction of the fin 90. The dummy gate 102 and the dummy gate dielectric 97 are collectively referred to as dummy gate structure, in some embodiments.

Next, a gate spacer layer 108' is formed by conformally depositing an insulating material over the layer stacks 92, the STI regions 96, and the dummy gates 102. The insulating material may be silicon nitride, silicon carbonitride, a combination thereof, or the like. In some embodiments, the gate spacer layer 108' includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer. FIGS. 5B and 5C illustrate cross-sectional views of the NSFET device 100 in FIG. 5A, but along cross-sections E-E' and F-F' in FIG. 5A, respectively, where the cross-sections E-E' and F-F' correspond to cross-sections C-C' and A-A' in FIG. 1, respectively. Similarly, FIGS. 6B, 7B, 8B, 9B, 10B, 11B, and 12B illustrate cross-sectional views of the NSFET device 100 along cross-section E-E' in FIG. 5A, and FIGS. 6C, 7C, 8C, 9C, 10C, 11C, 12C, 13B, 14B, and 15B illustrate cross-sectional views of the NSFET device 100 along cross-section F-F' in FIG. 5A.

Figure 6C:
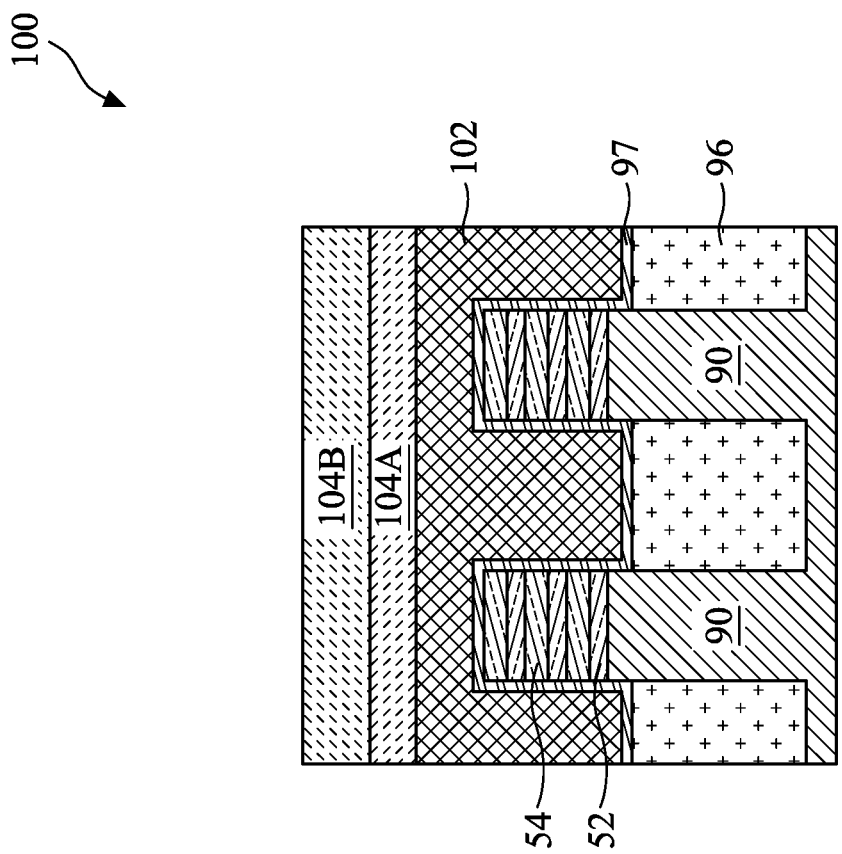

Next, in FIGS. 6A-6C, the gate spacer layer 108' is etched by an anisotropic etching process to form gate spacers 108. The anisotropic etching process may remove horizontal portions of the gate spacer layer 108' (e.g., portions over the STI regions 96 and the dummy gate 102), with remaining vertical portions of the gate spacer layer 108' (e.g., along sidewalls of the dummy gate 102 and the dummy gate dielectric 97) forming the gate spacers 108.

After the formation of the gate spacers 108, implantation for lightly doped source/drain (LDD) regions (not shown) may be performed. Appropriate type (e.g., p-type or n-type) impurities may be implanted into the exposed layer stacks 92 and/or the semiconductor fin 90. The n-type impurities may be any suitable n-type impurities, such as phosphorus, arsenic, antimony, or the like, and the p-type impurities may be any suitable p-type impurities, such as boron, $BF_2$, indium, or the like. The lightly doped source/drain regions may have a concentration of impurities of from about $10^{15}$ $cm^{-3}$ to about $1016$ $cm^{-3}$. An anneal process may be used to activate the implanted impurities.

Next, openings 110 (may also be referred to as recesses, or source/drain openings) are formed in the layer stacks 92. The openings 110 may extend through the layer stacks 92 and into the semiconductor fin 90. The openings 110 may be formed by any acceptable etching technique, using, e.g., the dummy gates 102 and the gate spacers 108 as an etching mask. The openings 110 expose end portions of the first semiconductor material 52 and end portions of the second semiconductor material 54.

Still referring to FIGS. 6A-6C, after the openings 110 are formed, a selective etching process (e.g., a wet etch process using an etching chemical) is performed to remove end portions of the first semiconductor material 52 exposed by the openings 110 without substantially attacking the second semiconductor material 54. After the selective etching process, recesses 52R are formed in the first semiconductor material 52 at locations where the removed end portions used to be. Note that due to the recesses 52R, sidewalls of the first semiconductor material 52 are recessed from sidewalls 54S of the second semiconductor material 54, and therefore, the recesses 52R may also be referred to as sidewall recesses 52R.

FIG. 6B illustrates the remaining portions of the gate spacer layer (labeled as 108) on the upper surface of the STI regions 96. The remaining portions of the gate spacer layer 108 may extend continuously from a fin 90 to an adjacent fin 90, as illustrated in FIG. 6B. In other embodiments, the remaining portions of the gate spacer layer 108 extend along sidewalls of the fins 90, but not continuously between adjacent fins 90, and therefore, may expose portions of the upper surface of the STI regions 96. In the example of FIG. 6B, the upper surface of the fin 90, which corresponds to the upper surface of a portion of the fin 90 directly under the opening 110 in FIG. 6A, is level with the upper surface of the STI region 96, although the upper surface of the fin 90 may also extend above or below the upper surface of the STI region 96.

Figure 7B:
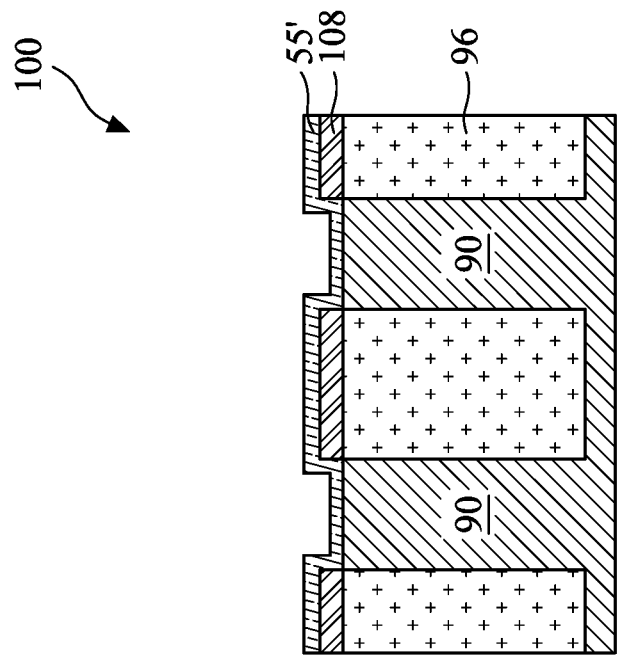
Figure 7A:
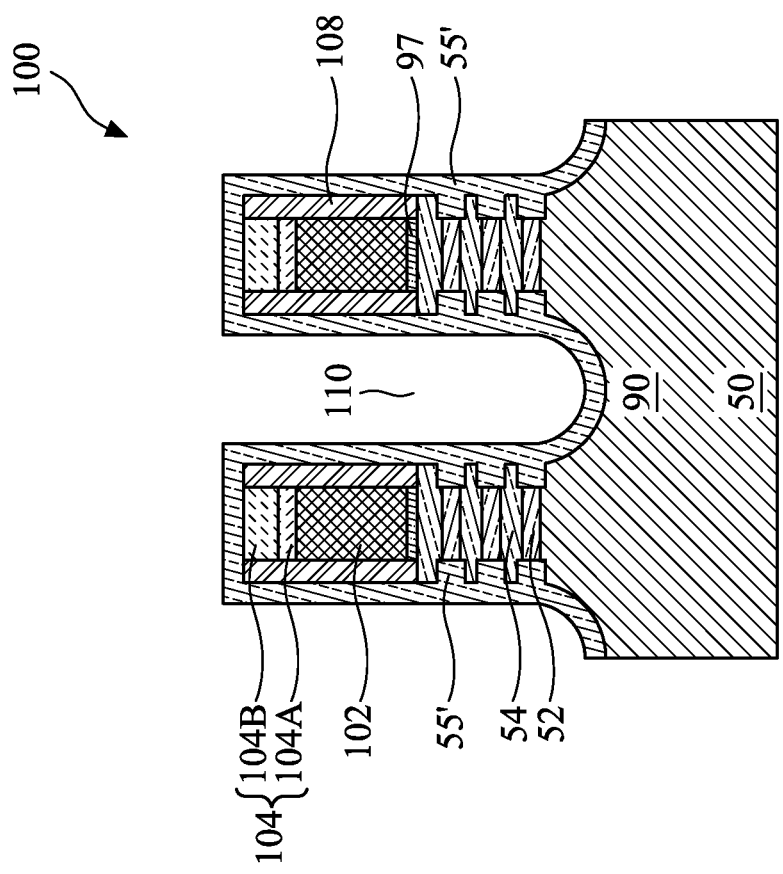
Figure 7C:
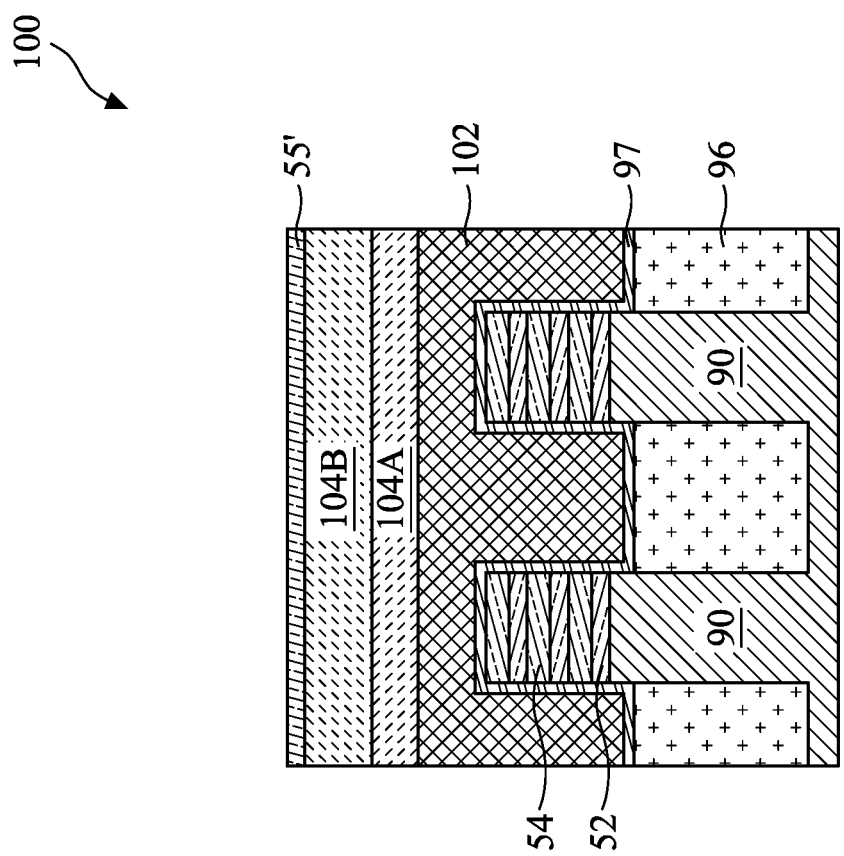

Next, in FIGS. 7A-7C, a spacer film 55' is formed (e.g., conformally) over the structure of FIGS. 6A-6C. As illustrated in FIGS. 7A-7C, the spacer film 55' extends along upper surfaces of the masks 104, and lines sidewalls and bottoms of the openings 110. Notably, the spacer film 55' fills (e.g., completely fills) the sidewall recesses 52R. The spacer film 55' may be, e.g., silicon nitride (SiN), silicon carbon nitride (SiCN), silicon oxycarbonitride (SiOCN), or the like, and may be formed by, e.g., CVD, PVD, atomic layer deposition (ALD), or the like.

Figure 8B:
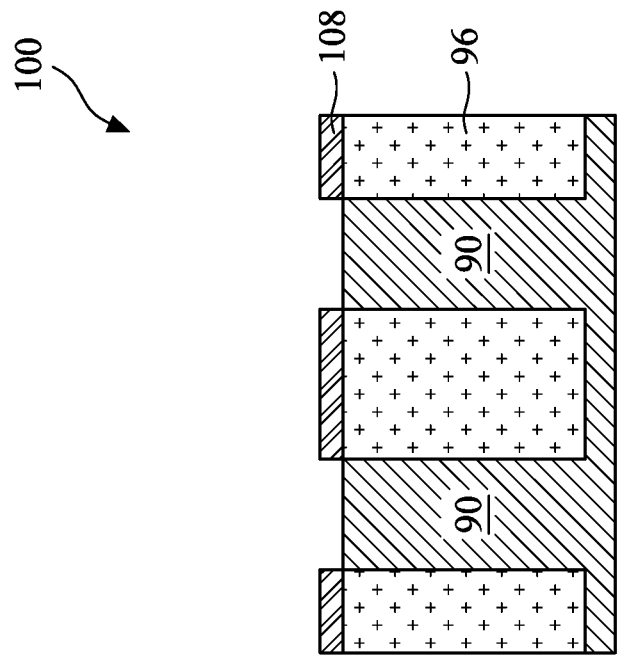
Figure 8A:
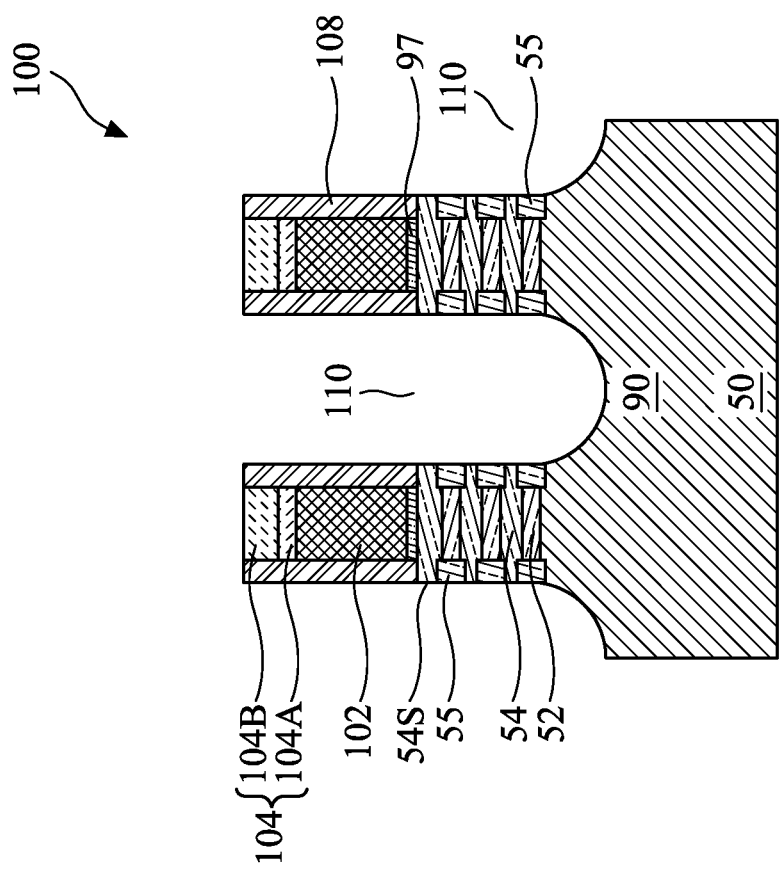
Figure 8C:
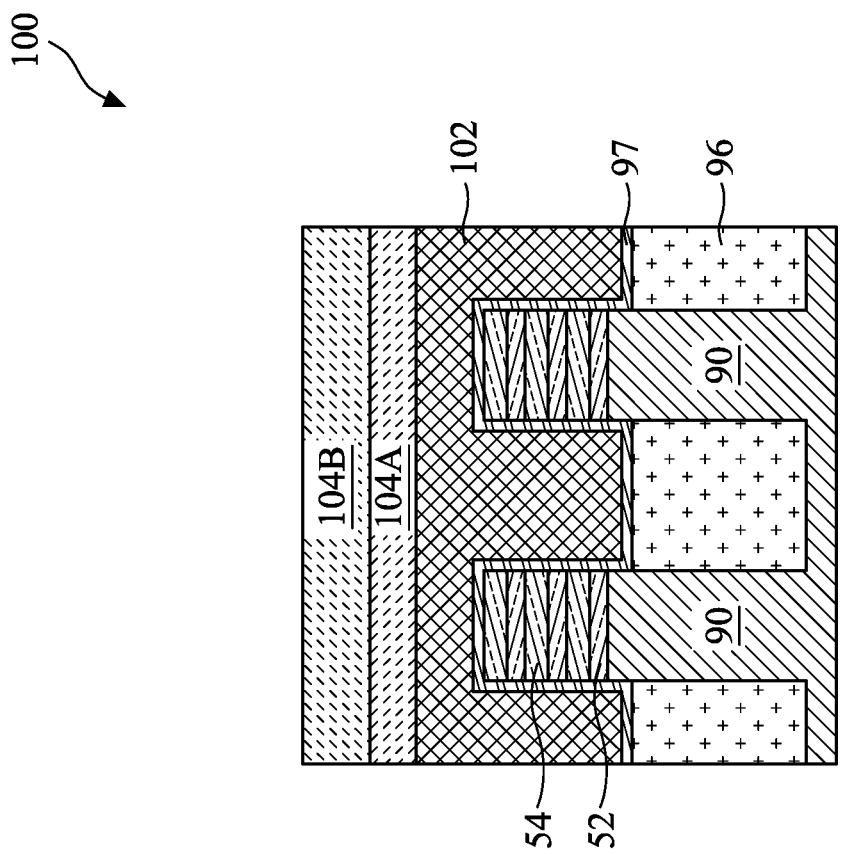

Next, in FIGS. 8A-8C, a trimming process (also referred to an inner-spacer trimming process) is performed to remove (e.g., completely remove) portions of the spacer film 55' disposed outside the sidewall recesses 52R, such as portions along the sidewalls and the bottoms of the openings 110 and portions along the upper surface of the dummy gate 102. After the trimming process, portions of the spacer film 55' inside the sidewall recesses 52R remain to form inner spacers 55.

In some embodiments, the trimming process is a suitable etching process, such as a dry etch process or a wet etch process. In an example embodiment, a dry etch process using a gas source comprising a mixture of $CHF_3$ and $O_2$, a mixture of $CF_4$ and $O_2$, a mixture of $NF_3$, $CH_3F$, and $CHF_3$, or the like, is performed to remove the portions of the spacer film 55' disposed outside the sidewall recesses 52R. Parameters of the dry etch process, such as the mixing ratio between the gases in the gas source, the pressure, and/or the flow rates of the gases, are tuned to adjust a lateral etching rate of the dry etch process. In the example of FIG. 8A, after the trimming process, sidewalls of the remaining portions of the spacer film 55' (or sidewalls of the inner spacer 55) are flush with sidewalls 54S of the second semiconductor material 54. In other embodiments, sidewalls of the inner spacers 55 may be recessed from the sidewalls 54S, or may extend toward the openings 110 beyond the sidewalls 54S of the second semiconductor material 54. These and other variations are fully intended to be included within the scope of the present disclosure.

Figure 9C:
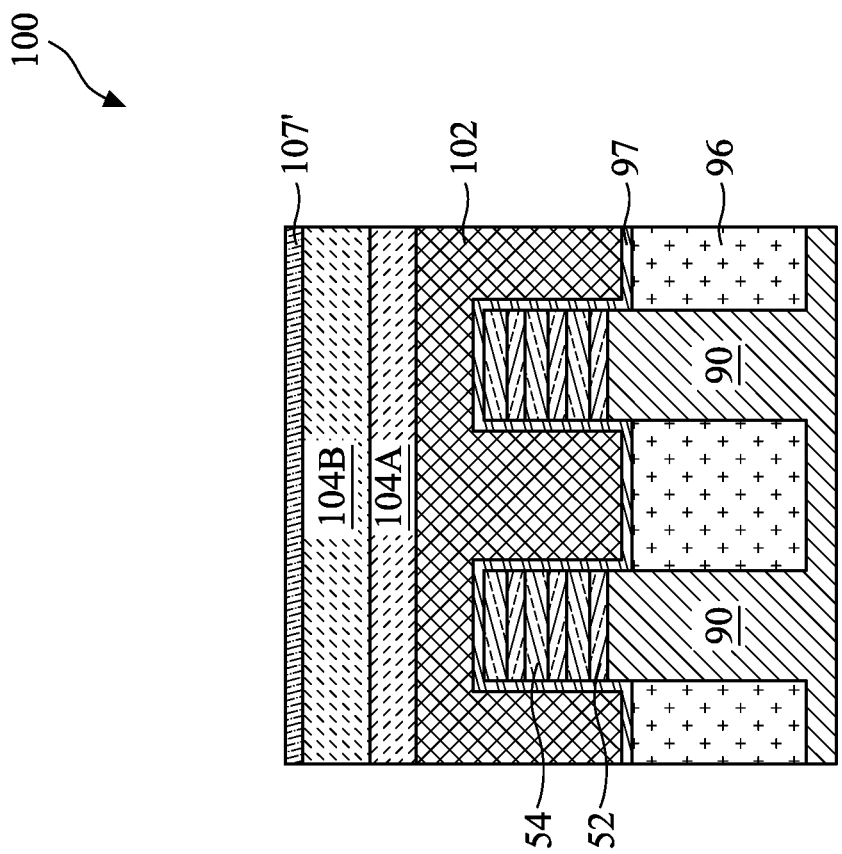

Next, in FIGS. 9A-9C, a dielectric material 107' is formed (e.g., conformally) over the dummy gate 102 and along the sidewalls and the bottoms of the openings 110. The dielectric material 107' may be, e.g., SiN, although other suitable material, such as SiCN, SiOCN, may also be used. A suitable formation method, such as ALD, PVD, CVD, may be used to form the dielectric material 107'.

Next, an implantation process 130 (e.g., an ion implantation process) is performed to treat the dielectric material 107'. The implantation process 130 may be performed using a gas source comprising carbon (C), oxygen (O), germanium (Ge), or combinations thereof. Ion species, such as ion species of C, O, Ge, or combinations thereof, are implanted into the dielectric material 107' to change the physical properties (e.g., hardness, etch rate) of the dielectric material 107', in some embodiments. Note that due to, e.g., the angle of the implantation process 130 and/or the aspect ratio of the openings 110, the concentration of the ion species implanted in the dielectric material 107' is non-uniform. For example, the concentration of the implanted ion species at bottom portions of the dielectric material 107' (e.g., portions at the bottoms of the openings 110) is higher than the concentration of the implanted ion species at sidewall portions of the dielectric material 107' (e.g., portions along the sidewalls of the openings 110). In some embodiments, the bottom portions of the dielectric material 107' are implanted (e.g., doped) with the ion species, and the sidewall portions of the dielectric material 107' are substantially free of the ion species, which results in a large etching selectivity between the bottom portions and the sidewall portions of the dielectric material 107'. In some embodiments, the concentration of the implanted ion species in the dielectric material 107' decreases gradually from the bottom portions of the dielectric material 107' toward the sidewall portions of the dielectric material 107' (e.g., along the directions illustrated by the arrows 131 in FIG. 10A). In an example embodiment, as a result of the implantation process 130, the bottom portions of the dielectric material 107' has a lower etch rate than the sidewall portions of the dielectric material 107' in a subsequent etching process.

In accordance with some embodiments, the dielectric material 107' is formed to have a thickness between about 1 nm and about 10 nm. In some embodiments, if the thickness of the dielectric material 107' is too small (e.g., smaller than about 1 nm), then the subsequently formed dielectric layer 107 (see FIGS. 10A-10C) may not provide enough electrical insulation to prevent or reduce leakage current. If the thickness is too large (e.g., larger than about 10 nm), the dielectric material 107' along the sidewalls of the openings 110 may merge together and fill the openings 110, thus preventing the implantation process from reaching the bottom portions of the dielectric material 107', which in turn prevents the dielectric layer 107 (see FIGS. 10A-10C) from being formed properly.

Figure 10C:
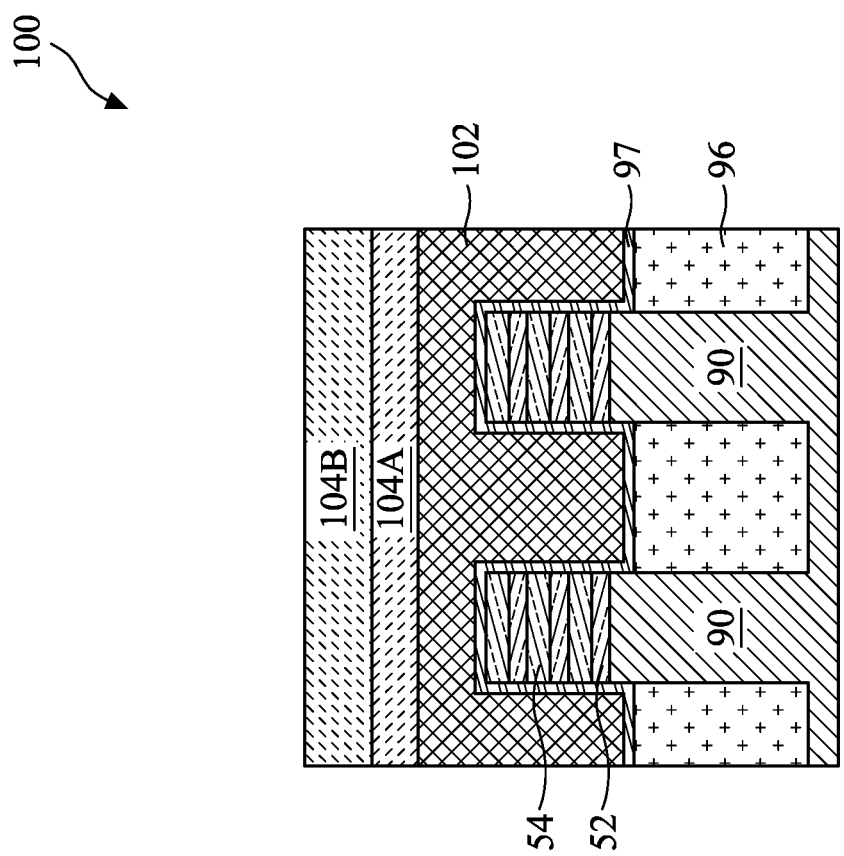

Next, in FIGS. 10A-10C, a suitable etching process, such as a dry etch or wet etch, is performed to remove portions of the dielectric material 107' disposed along the sidewalls of the openings 110 and over the dummy gates 102. The etching process is stopped after the dielectric material 107' is removed from the sidewalls of the openings 110 and from over the dummy gates 102. Note that due to the etching selectivity between the bottom portions and the sidewall portions of the dielectric material 107', after the etching process is stopped, the bottom portions of the dielectric material 107' remain to form a dielectric layer 107 at the bottoms of the openings 110. In the example of FIG. 10A, the dielectric layer 107 extends continuously along the upper surface of the fin 90 from a first inner spacer 55 (e.g., a lowermost inner spacer 55 under the dummy gate 102 on the left) to a second inner spacer 55 (e.g., a lowermost inner spacer 55 under the dummy gate 102 on the right). Note that the dielectric layer 107 contacts (e.g., physically contacts) the lowermost inner spacers 55, and the upper surface 107U of the dielectric layer 107 is lower (e.g., closer to the substrate 50) than a lowermost surface of the second semiconductor material 54 facing the substrate 50, which allows the subsequently formed source/drain regions 112 to be electrically connected to the second semiconductor material 54 (e.g., the channel regions of the NSFETs) without being blocked by the dielectric layer 107.

FIG. 10B illustrates the dielectric layer 107 covering (e.g., contacting and extending along) the upper surfaces of the fins 90 and extending continuously from a first fin 90 (e.g., the fin 90 on the left) to an adjacent second fin 90 (e.g., the fin 90 on the right).

Figure 11B:
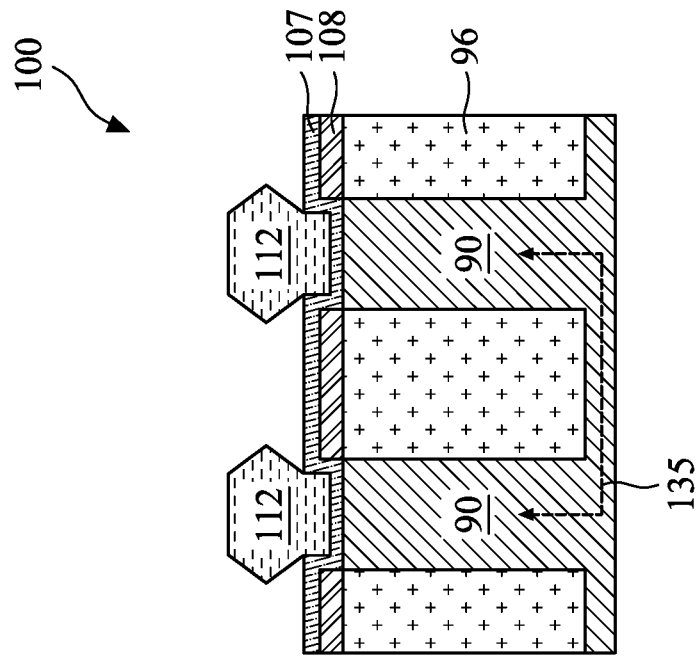
Figure 11A:
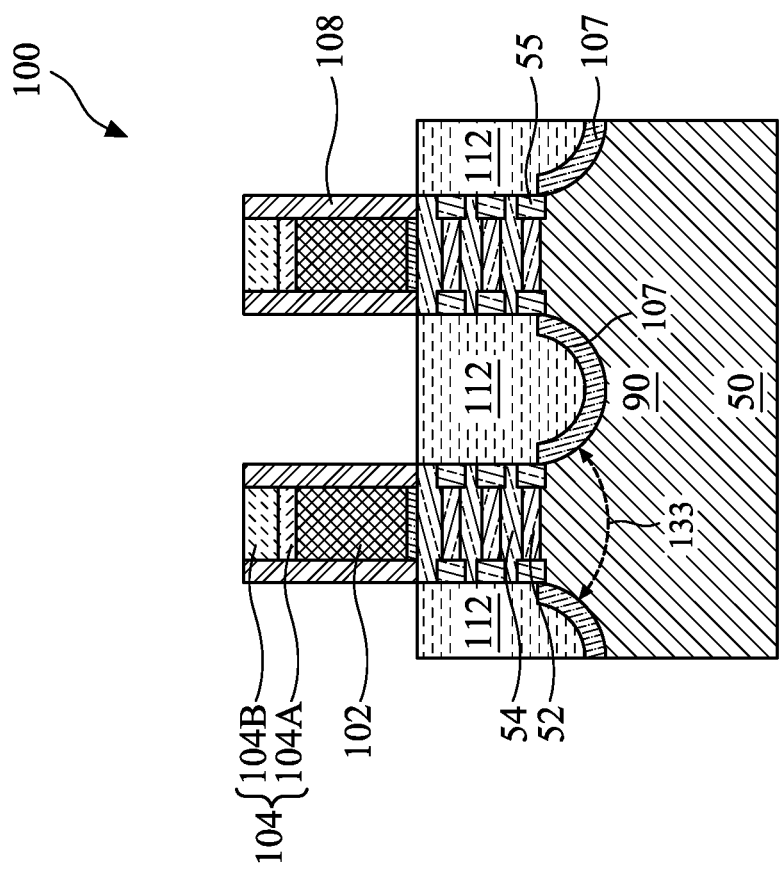
Figure 11C:
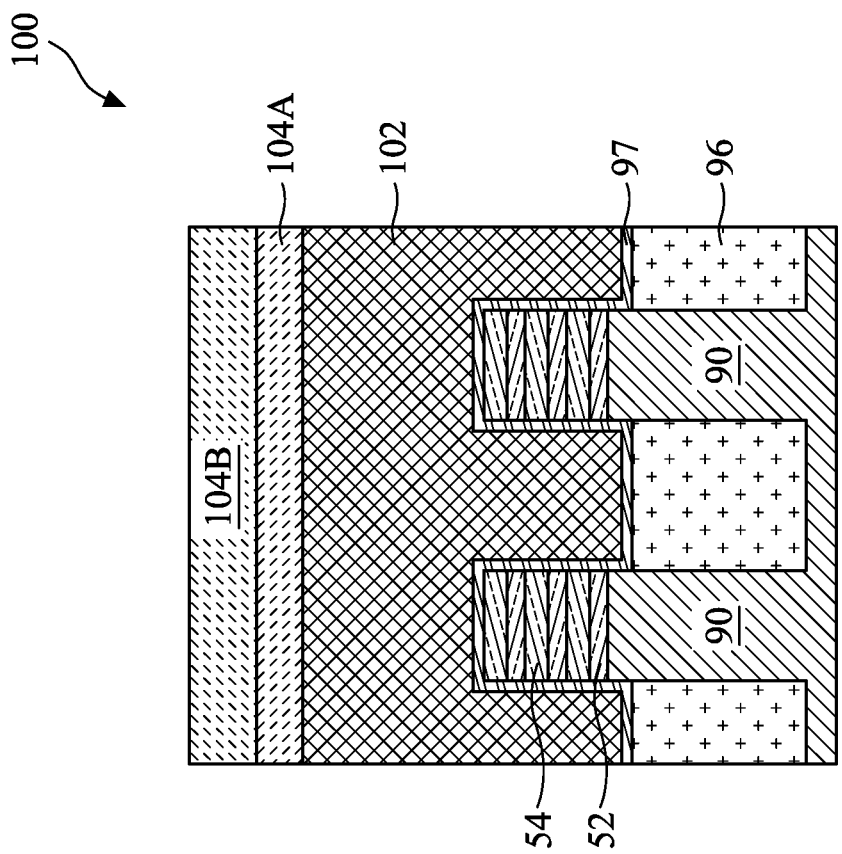

Next, in FIGS. 11A-11C, source/drain regions 112 are formed in the openings 110. In some embodiments, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed to increase carrier mobility, thereby improving device performance. The epitaxial source/drain regions 112 are formed such that each dummy gate 102 is disposed between neighboring pairs of the epitaxial source/drain regions 112. In some embodiments, the gate spacers 108 are used to separate the epitaxial source/drain regions 112 from the dummy gate 102 by an appropriate lateral distance so that the epitaxial source/drain regions 112 do not short out subsequently formed gate of the resulting NSFET device.

The epitaxial source/drain regions 112 are epitaxially grown in the openings 110, in some embodiments. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins 90 and may have facets.

The epitaxial source/drain regions 112 and/or the fins 90 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fin 90. In some embodiments, adjacent epitaxial source/drain regions 112 disposed over adjacent fins 90 remain separated after the epitaxy process is completed, as illustrated in FIG. 11B. In other embodiments, these facets cause adjacent epitaxial source/drain regions 112 disposed over adjacent fins 90 of a same NSFET to merge and form a continuous source/drain region 112 over adjacent fins 90.

As illustrated in FIG. 11B, the dielectric layer 107 under the source/drain regions 112 separates (e.g., physically separates) the source/drain regions 112 from the underlying fins 90. Similarly, as illustrated in FIG. 11A, since the dielectric layer 107 contacts (e.g., physically contacts) sidewalls of the lowermost inner spacers 55, the source/drain regions 112 are separated from the underlying fin 90 by the dielectric layer 107.

As feature sizes continue to shrink in advanced semiconductor manufacturing process, new challenges arise. For example, substrate leakage, which refers to leakage current between adjacent source/drain regions 112 through the substrate 50 (see dashed leakage path 133 in FIG. 11A), may increase. In addition, well isolation leakage, which refers to leakage current between adjacent well regions, may also increase. To help understand the well isolation leakage path, assume that the fin 90 on the left side of FIG. 11B has an n-type well region, and the fin 90 on the right side of FIG. 11B has a p-type well region, then the dashed line 135 in FIG. 11B illustrates a well isolation leakage path between an n-type well region (also referred to as an n-well) and a p-type well region (also referred to as a p-well). Note that in FIG. 11B, both fins 90 are in an n-type device region and have p-type well regions, therefore, there is no well isolation leakage between the fins 90 in FIG. 11B. The dashed line 135 is drawn to help understanding of the well isolation leakage between two adjacent fins having different types of well regions.

The present disclosure, by forming the dielectric layer 107 under the source/drain regions 112, isolates (e.g., electrically isolates) the source/drain region 112 from the underlying fins 90, thus blocking the substrate leakage paths and the well isolation leakage paths, which in turn prevents or reduces substrate leakage and well isolation leakage and improves device performance.

Figure 12B:
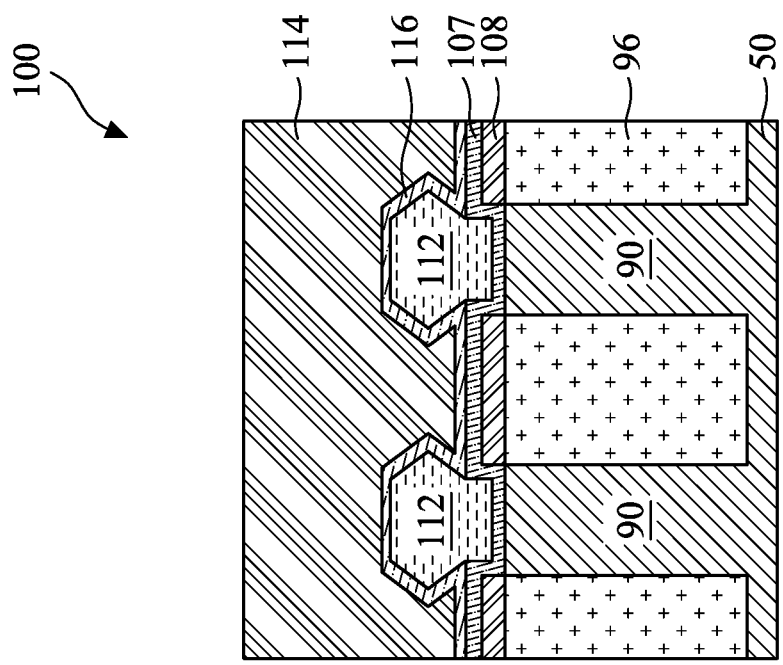
Figure 12A:
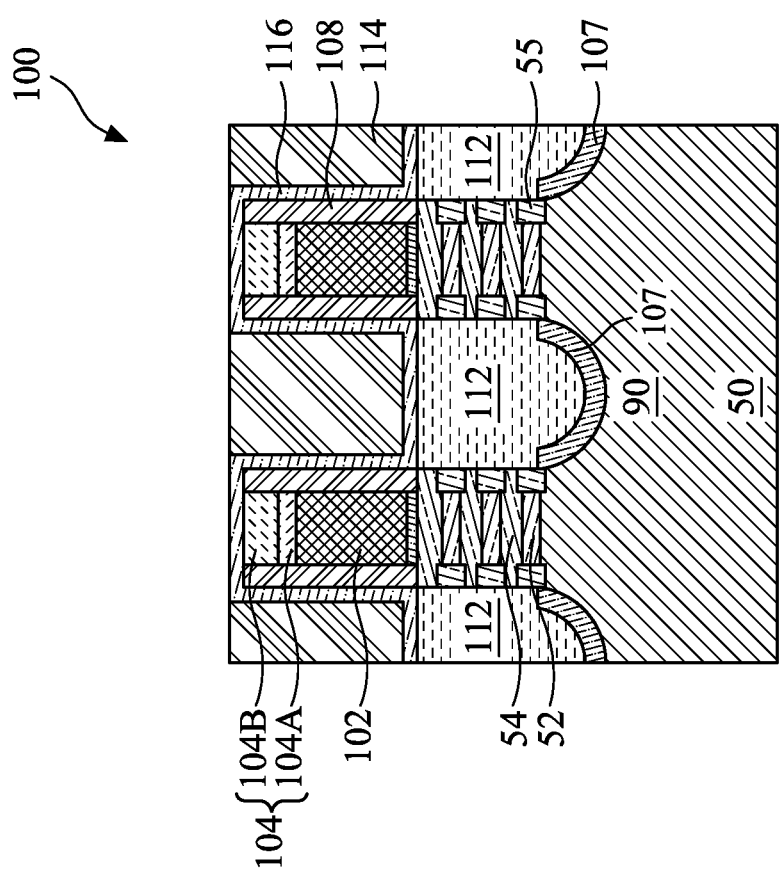
Figure 12C:
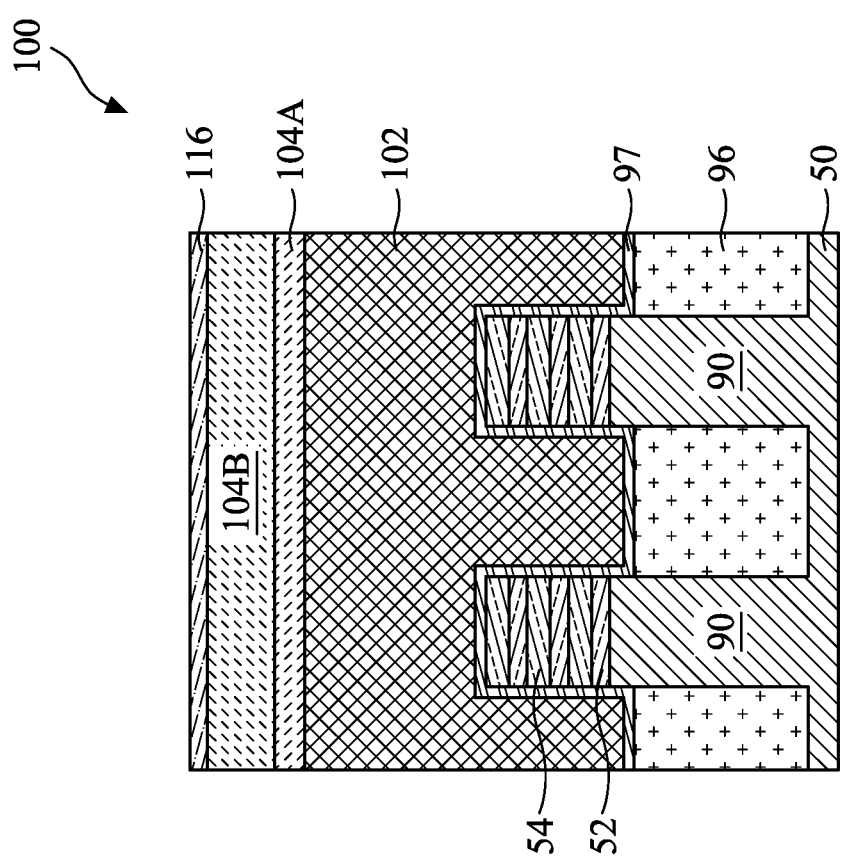

Next, in FIGS. 12A-12C, a contact etch stop layer (CESL) 116 is formed (e.g., conformally) over the source/drain regions 112 and over the dummy gate 102, and an inter-layer dielectric (ILD) 114 is then deposited over the CESL 116. The CESL 116 is formed of a material having a different etch rate than the ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could be used.

The ILD 114 may be formed of a dielectric material, and may be deposited by any suitable method, such as CVD, plasma-enhanced CVD (PECVD), or FCVD. Dielectric materials for the ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other dielectric materials formed by any acceptable process may be used.

The cross-sectional view of FIG. 12B remains the same for the subsequent processing steps illustrated in FIGS. 13A, 13B, 14A, 14B, 15A, and 15B, thus is not repeated.

Next, in FIGS. 13A and 13B, the dummy gates 102 are removed. To remove the dummy gates 102, a planarization process, such as a CMP, may be performed to level the top surfaces of the ILD 114 and CESL 116 with the top surfaces of the dummy gates 102 and gate spacers 108. The planarization process may also remove the masks 104 (see FIG. 12A) on the dummy gates 102, and portions of the gate spacers 108 along sidewalls of the masks 104. After the planarization process, top surfaces of the dummy gates 102, gate spacers 108, and ILD 114 are level. Accordingly, the top surfaces of the dummy gates 102 are exposed at the upper surface of the ILD 114.

After the planarization process, the dummy gates 102 are removed in an etching step(s), so that recesses 103 (may also be referred to as openings 103) are formed between the gate spacers 108. In some embodiments, the dummy gates 102 are removed by an anisotropic dry etch process. For example, the etching process may include a dry etch process using reaction gas(es) that selectively etch the dummy gate 102 without etching the ILD 114 or the gate spacers 108. The recesses 103 expose the channel regions of the NSFET device 100. The channel regions are disposed between neighboring pairs of the epitaxial source/drain regions 112. During the removal of the dummy gates 102, the dummy gate dielectric 97 may be used as an etch stop layer when the dummy gates 102 is etched. The dummy gate dielectric 97 may then be removed after the removal of the dummy gates 102. After the dummy gates 102 are removed, the first semiconductor material 52 and the second semiconductor material 54 that were disposed under (e.g., directly under) the dummy gates 102 are exposed by the recesses 103.

Figures 14A, 14B:
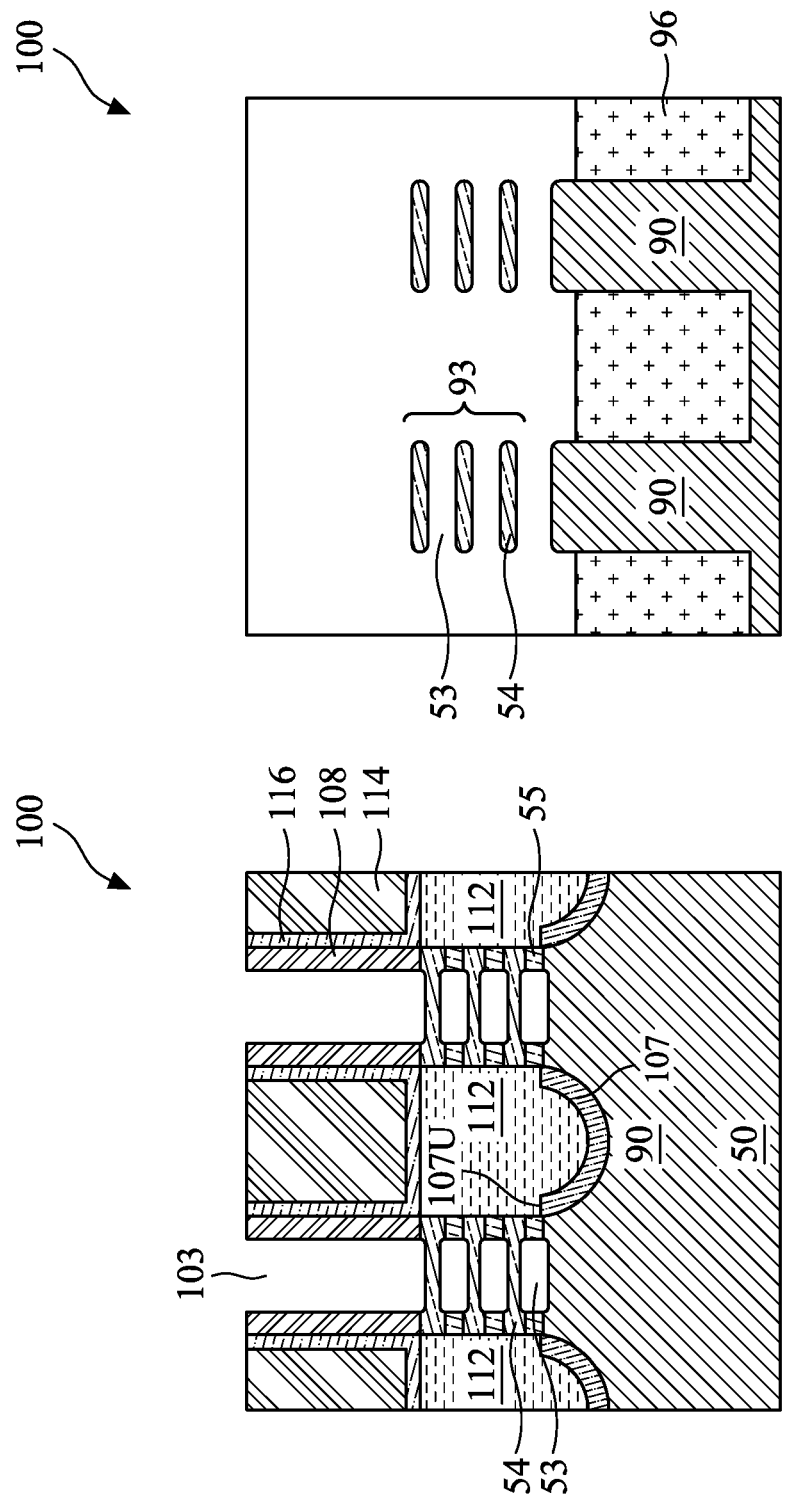

Next, in FIGS. 14A and 14B, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface of the substrate 50). Depending on, e.g., the dimension of the nanostructure 54, the nanostructures 54 may also be referred to as nanosheets or nanowires, and the NSFET device 100 may also be referred to as a gate-all-around (GAA) device, in some embodiments. The nanostructures 54 may be collectively referred to as the channel regions 93 or the channel layers 93 of the NSFET device 100 formed. As illustrated in FIGS. 14A and 14B, gaps 53 (e.g., empty spaces) are formed between the nanostructures 54 by the removal of the first semiconductor material 52.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas. In some embodiments, the etching gas comprises HF, a mixture of $F_2$ and HF, or the like, and the carrier gas may be an inert gas such as Ar, He, $N_2$, combinations thereof, or the like. In some embodiments, an etchant such as dissolved ozone in de-ionized water (DIO) is used to selectively remove the first semiconductor material 52.

In the illustrated embodiment, the upper surface 107U of the dielectric layer 107 is lower (e.g., closer to the substrate 50) than a lower surface of a lowermost nanostructure 54 facing the substrate 50. This feature ensures that the dielectric layer 107 does not interfere with (e.g., block, or partially block) the electrical connection between the source/drain regions 112 and the nanostructures 54. Otherwise, the electrically resistance between the source/drain regions 112 and the nanostructures 54 may be negatively impacted (e.g., increased).

Figures 15A, 15B:
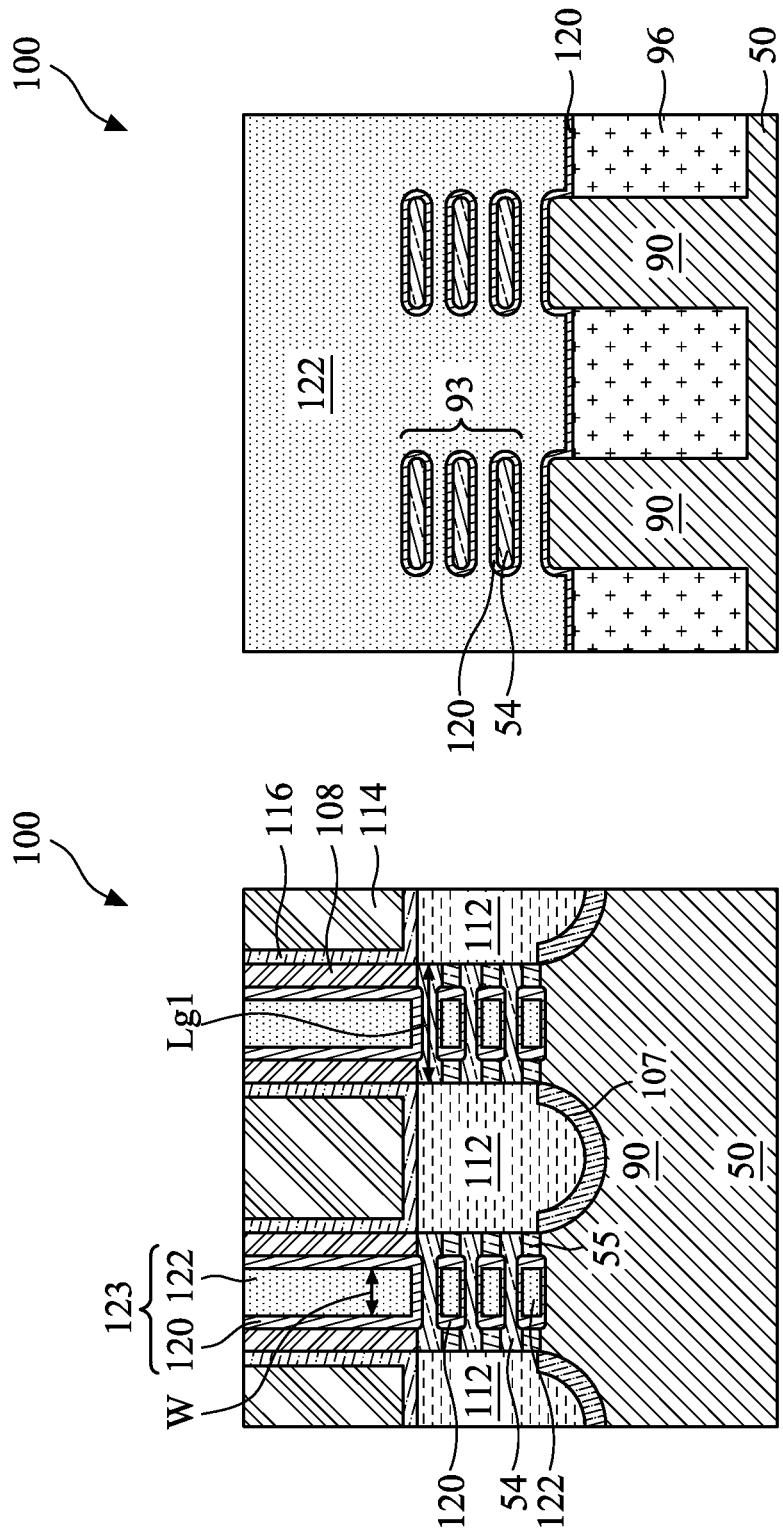
Figure 16A:
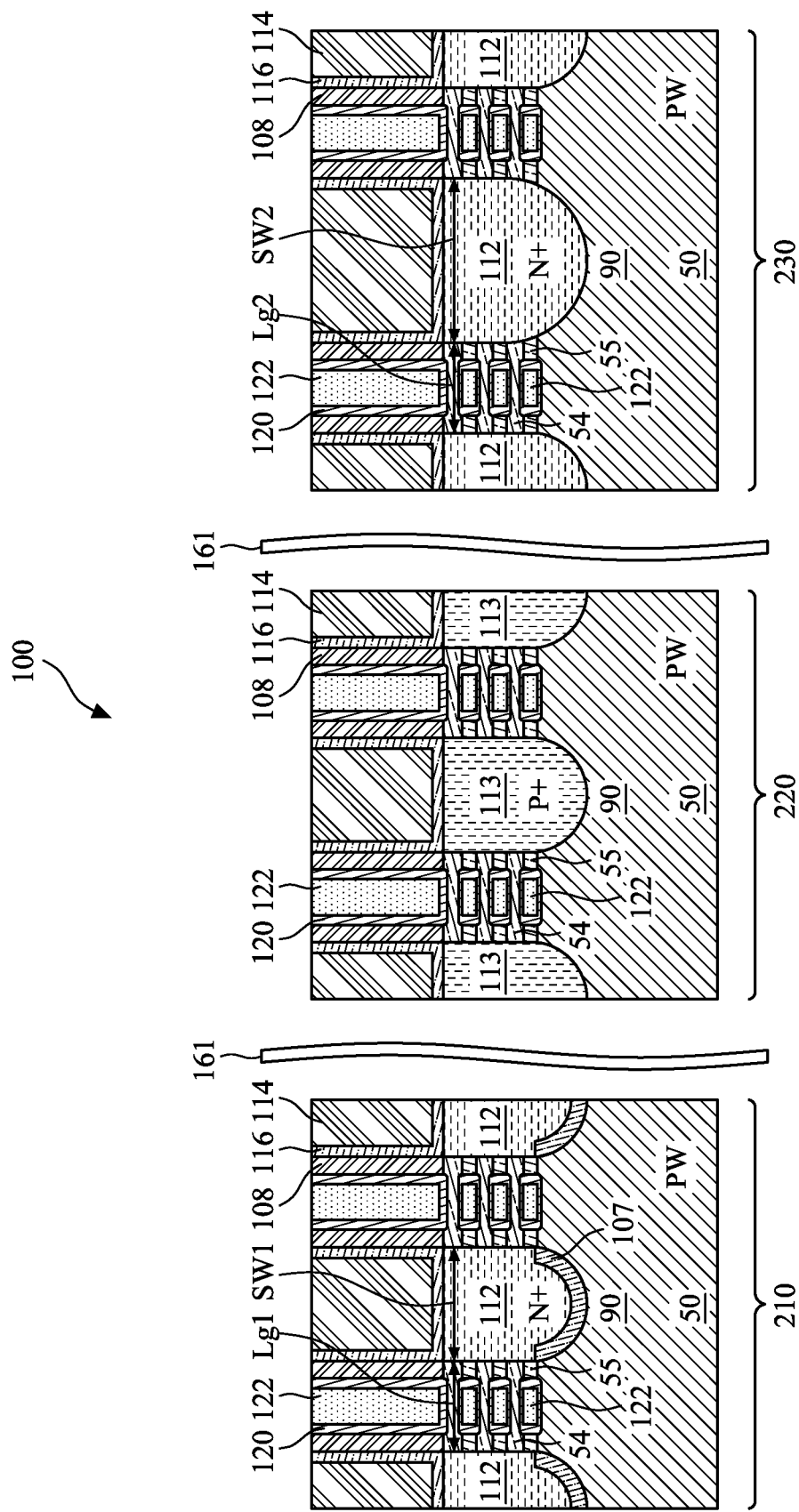
Figure 16B:
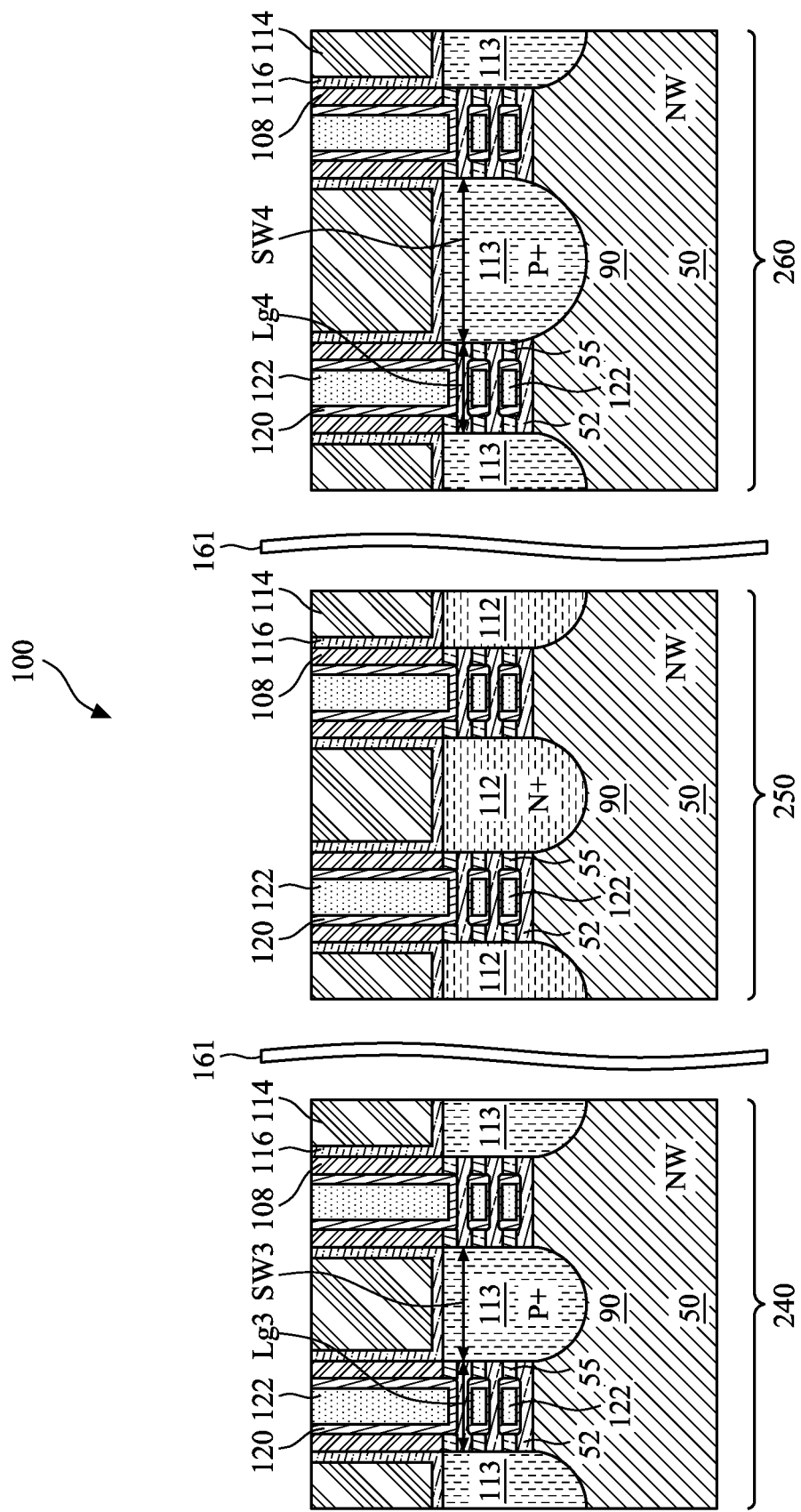

Next, in FIGS. 15A and 15B, a gate dielectric layer 120 is formed (e.g., conformally) in the recesses 103 and in the gaps 53. The gate dielectric layer 120 wraps around the nanostructures 54, lines sidewalls of the inner spacers 55 and sidewalls of the gate spacers 108, and extends along the upper surfaces and sidewalls of the fins 90. In accordance with some embodiments, the gate dielectric layer 120 comprises silicon oxide, silicon nitride, or multilayers thereof. In some embodiments, the gate dielectric layer 120 includes a high-k dielectric material, and in these embodiments, the gate dielectric layer 120 may have a dielectric constant greater than about 7.0, and may include a metal oxide or a silicate of Hf, Al, Zr, La, Mg, Ba, Ti, or Pb, or combinations thereof. The formation methods of the gate dielectric layer 120 may include Molecular-Beam Deposition (MBD), ALD, PECVD, or the like.

Next, a gate electrode material (e.g., an electrically conductive material) is formed in the recesses 103 and the gaps 53 to form the gate electrodes 122. The gate electrodes material fills the remaining portions of the recesses 103 and the gaps 53. The gate electrodes material may be a metal-containing material such as Cu, Al, W, the like, combinations thereof, or multi-layers thereof, and may be formed by, e.g., electroplating, electroless plating, or other suitable method. After the gate electrode material is formed, a planarization process, such as a CMP, may be performed to remove excess portions of the gate dielectric layer 120 and the gate electrode material, which excess portions are over the top surface of the ILD 114. The remaining portions of the gate electrode material and the gate dielectric layer 120 thus form replacement gates of the resulting NSFET device 100. The gate electrode 122 and the corresponding gate dielectric layer 120 may be collectively referred to as a gate stack 123, a replacement gate structure 123, or a metal gate structure 123. Each gate structure 123 extends over and around the respective nanostructures 54.

Although the gate electrode 122 is illustrated as a single layer in the example of FIGS. 15A and 15B, one skilled in the art will readily appreciate that the gate electrode 122 may have a multi-layered structure and may include a plurality of layers, such as a barrier layer, a work function layer, a seed layer and a fill metal.

For example, a barrier layer may be formed conformally over the gate dielectric layer 120. The barrier layer may comprise an electrically conductive material such as titanium nitride, although other materials, such as tantalum nitride, titanium, tantalum, or the like, may alternatively be utilized. A work function layer may be formed over the barrier layer. Exemplary p-type work function materials (may also be referred to as p-type work function metals) include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the work function layer is chosen to tune its work function value so that a target threshold voltage VTH is achieved in the device that is to be formed. Next, a seed layer may be formed over the work function layer. The seed layer may be formed of tungsten, copper, or copper alloys, although other suitable materials may alternatively be used. Once the seed layer has been formed, the fill metal may be formed onto the seed layer, filling the openings 103 and the gaps 53. The fill metal may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized.

FIGS. 15A and 15B illustrate NSFETs formed in a first device region (see, e.g., 210 in FIG. 16A) of an n-type device region of the NSFET device 100. The n-type device region of the NSFET device 100 may include other regions, such as a second device region 230 and a pick-up region 220 as illustrated in FIG. 16A. In addition, processing steps similar to those illustrated above for forming the NSFETs of FIGS. 15A and 15B may be performed to form p-type NSFETs in a p-type device region of the NSFET device 100, as illustrated in FIG. 16B. In other words, FIGS. 16A and 16B illustrate the n-type device region and the p-type device region of the NSFET device 100, respectively. Details are discussed below.

Referring now to FIG. 16A, which illustrates an n-type device region of the NSFET device 100, which further includes a first device region 210, a second device region 230, and a pick-up region 220. In an embodiment, the NSFETs of FIGS. 15A and 15B are formed in the first device region 210, where the NSFETs have a channel length Lg1 between, e.g., about 5 nm and about 30 nm and a contacted poly pitch (CPP) in a range between, e.g., about 20 nm and about 70 nm. The CPP of the first device region 210 may be calculated as the sum of the channel length Lg1 and a width SW1 of the source/drain region 112 in the first device region 210. Due to the short channel length Lg1, the first device region 210 may also be referred to as a short channel region.

The second device region 230 corresponds to a device region with NSFETs having a channel length Lg2 between, e.g., 30 nm and about 150 nm and a CPP larger than about 70 nm, where the CPP of the second device region 230 is calculated as the sum of Lg2 and a width SW2 of the source/drain region 112 in the second device region 230. The second device region 230 may also be referred to as a large channel region. In the illustrated embodiment, the width SW2 of the source/drain region 112 in the second device region 230 is larger than the width SW1 of the source/drain region 112 in the first device region 210.

FIG. 16A further illustrates a pick-up region 220, where the source/drain regions in the pick-up region 220 are labeled as source/drain regions 113 to distinguish from the source/drain regions 112 in the first device region 210 and the second device region 230. In particular, the source/drain regions 112 in the first device region 210 and in the second device region 230 are doped with n-type dopant(s) in order to form n-type NSFETs. In contrast, the source/drain regions 113 in the pick-up region 220 are doped with p-type dopant(s) in order to form the pick-up region 220. Note that the fins 90 in the first device region 210, the second device region 230, and the pick-up region 220 are doped with p-type dopant(s) to form p-wells in the fins 90. In some embodiments, the fins 90 in the first device region 210, the second device region 230, and the pick-up region 220 are the same fin. In other words, the first device region 210, the second device region 230, and the pick-up region 220 are formed in a same fin 90. In other embodiments, the first device region 210, the second device region 230, and the pick-up region 220 are formed in different fins 90 located in the n-type device region of the NSFET device 100.

FIG. 16B illustrates the p-type device region of the NSFET device 100, which further includes a first device region 240, a second device region 260, and a pick-up region 250. Note that to form p-type NSFETs in the p-type device region, the second semiconductor material 54 is selectively removed after removing the dummy gates 102 and the dummy gate dielectric 97, and the first semiconductor material 52 remains and forms nanostructures 52 suitable for forming p-type NSFETs, as illustrated in FIG. 16B. In addition, the inner spacers 55 are formed by replacing end portions of the second semiconductor material 54. One skilled in the art will also appreciate that the fins 90 in the p-type device region are doped with n-type dopant(s) to form n-wells. The source/drain regions in the first device region 240 and the second device region 260 are labeled as source/drain regions 113 to indicate that p-type dopant(s) are added to form the source/drain regions for p-type NSFETs, and the source/drain region in the pick-up region 250 is labeled as source/drain regions 112 to indicate that n-type dopant(s) are added in order to form the pick-up region.

In some embodiments, the channel length Lg3 and the width SW3 of the first device region 240 of the p-type device region are the same as or similar to Lg1 and SW1, respectively, of the first device region 210 of the n-type device region. Similarly, the channel length Lg4 and the width SW4 of the second device region 260 of the p-type device region are the same as or similar to Lg2 and SW2, respectively, of the second device region 230 of the n-type device region. In some embodiments, the fins 90 in the first device region 240, the second device region 260, and the pick-up region 250 are the same fin. In other words, the first device region 240, the second device region 260, and the pick-up region 250 are formed in a same fin 90. In other embodiments, the first device region 240, the second device region 260, and the pick-up region 250 are formed in different fins 90 located in the p-type device region of the NSFET device 100.

Note that in the illustrated embodiment of FIGS. 16A and 16B, the dielectric layer 107 is formed only under the source/drain regions 112 in the first device region 210 of the n-type device region. The dielectric layer 107 is not formed in the p-type device region (e.g., 240, 250, and 260), nor is the dielectric layer 107 formed in the second device region 230 or the pick-up region 220 of the n-type device region. In some embodiments, in order to provide strain effectively on the channel regions of the NSFETs, the source/drain regions 113 of the p-type device region in FIG. 16B need to grow from the fin 90 to form high-qualify epitaxial semiconductor material, while the source/drain regions 112 in the n-type device region of FIG. 16A have little or no such concern regarding the strain. Therefore, the dielectric layer 107 is not formed under the source/drain region 113 in the p-type device region but formed under the source/drain regions 112 in the first device region 210 (e.g., a small channel region) of the n-type device region. In addition, the second device region 230 (e.g., a larger channel region) of the n-type device region in FIG. 16A has a large CPP (e.g., a large source/drain width SW2) and may need epitaxial growth from the fin 90 to form large volumes of epitaxial material as the source/drain regions 112. In other words, if the dielectric layer 107 were formed under the source/drain regions 112 of the second device region 230, the dielectric layer 107 would cover the bottoms of the openings 110 and prevent epitaxial growth from the fins 90, and epitaxial growth of the source/drain regions 112 from the sidewalls of the second semiconductor material 54 may not be enough (e.g., not having a large enough volume) to fill the source/drain openings 110. Furthermore, epitaxial growth in the source/drain openings 110 from the fin 90 may also be needed to provide access to the voltage of the substrate 50 in the pick-up regions 220 and 250, and therefore, no dielectric layer 107 is formed at the bottoms of the openings 110 in the pick-up regions (e.g., to prevent blocking of the access to the substrate voltage). Note that forming the dielectric layer 107 under the source/drain regions 112 of the n-type device region alone is enough to prevent or reduce the well isolation leakage between the fin 90 comprising the first device region 210 (e.g., a fin with a p-well) and a neighboring fin 90 comprising the p-type device region (e.g., a fin with an n-well).

Additional processing may be performed to finish fabrication of the NSFET device 100, as one of ordinary skill readily appreciates, thus details may not be repeated here. For example, a second ILD may be deposited over the ILD 114. Further, gate contacts and source/drain contacts may be formed extending through the second ILD and/or the ILD 114 to electrically couple to the gate electrode 122 and the source/drain regions 112/113. In addition, interconnect structures, which include conductive features (e.g., vias, metal lines) formed in a plurality of dielectric layers, may be formed over the second ILD to interconnect the electrical components (e.g., transistors) to form functional circuits.

Beside the embodiment disclosed above, other embodiments to form a dielectric layer under the source/drain regions 112 of the short channel region (e.g., 210) in the n-type device region are possible and are fully intended to be included within the scope of the present disclosure. Additional embodiments (e.g., 100A, 100B, 100C) are discussed hereinafter. Note that the additional embodiments (e.g., 100A, 100B, 100C) only illustrate cross-sectional view of portions of the NSFET device in the first device region 210 (e.g., a short channel region in an n-type device region), and other device regions (e.g., 220, 230, 240, 250, 260) are the same as or similar to those disclosed above, thus details are not repeated.

FIGS. 17, 18, and 19A-19C are cross-sectional views of a nanostructure field-effect transistor (NSFET) device 100A at various stages of manufacturing, in accordance with another embodiment. The processing of FIG. 17 follows the processing of FIGS. 8A-8C, in some embodiments.

Figure 17:
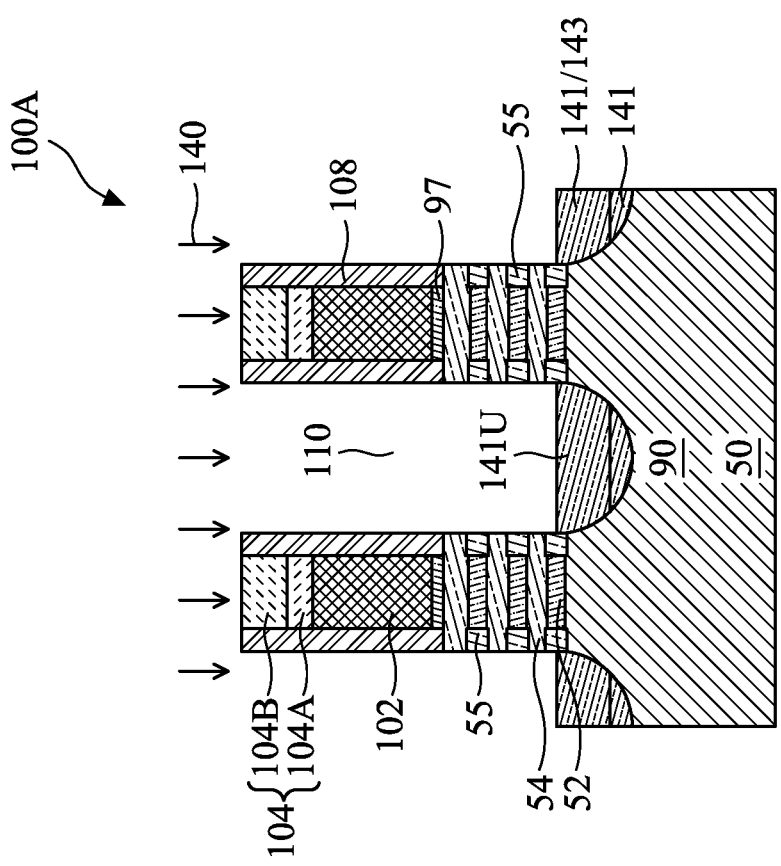

As illustrated in FIG. 17, after the inner spacers 55 are formed in FIG. 8A, a semiconductor material 141 (e.g., silicon) is formed in the openings 110 by, e.g., an epitaxial growth process. An upper surface 141U of the semiconductor material 141 is higher (e.g., further from the substrate 50) than a lowermost surface of the inner spacers 55 facing the substrate 50. In other words, the semiconductor material 141 contacts (e.g., physically contacts) sidewalls of the lowermost inner spacers 55, and extends continuously from a first lowermost inner spacer 55 (e.g., a lowermost inner spacer 55 under the dummy gate 102 on the left of FIG. 17) to a laterally adjacent second lowermost inner spacer 55 (e.g., a lowermost inner spacer 55 under the dummy gate 102 on the right of FIG. 17).

Next, an implantation process 140 (e.g., an ion implantation process) is performed to treat the semiconductor material 141. The implantation process 140 may use a gas source comprising fluoride (F), germanium (Ge), oxygen (O), or argon (Ar), such that ion species of F, Ge, O, or Ar are implanted into the semiconductor material 141. As illustrated in FIG. 17, after the implantation process 140, an upper layer of the semiconductor material 141 is converted into a treated layer 143 (e.g., semiconductor material 141 doped with ion species of F, Ge, O, or Ar) that has different physical properties (e.g., hardness, etch rate) from the semiconductor material 141.

Figure 18:
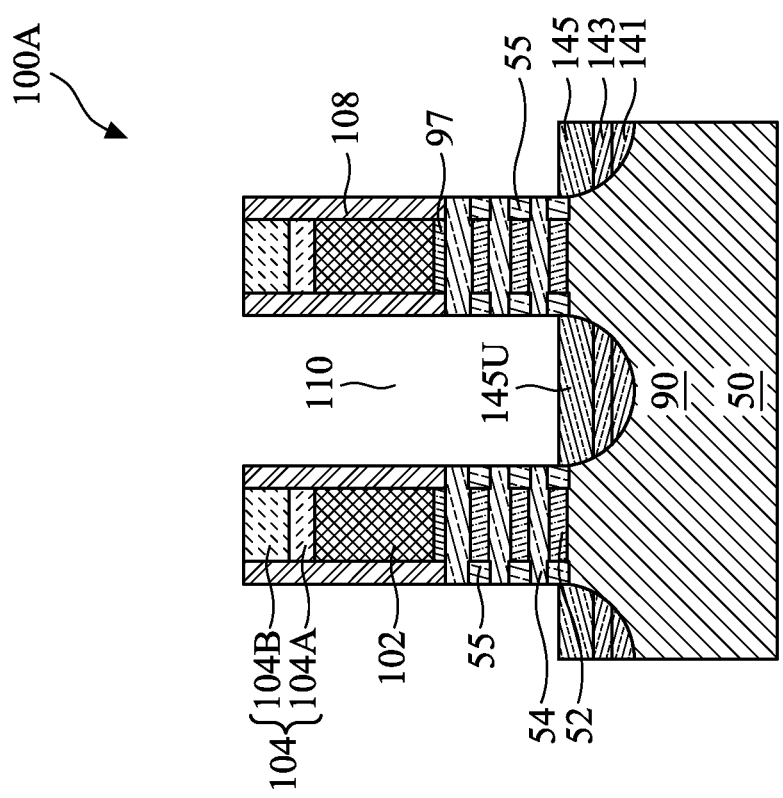

Next, in FIG. 18, an oxidization process is performed to convert an upper layer of the treated layer 143 into a dielectric layer 145 (e.g., an oxide layer such as a silicon oxide layer). In an embodiment, a furnace oxidization process using a gas source comprising hydrogen ($H_2$) and oxygen ($O_2$) is performed to form the dielectric layer 145. Note that due to the ion species doped (e.g., implanted) into the dielectric layer 145, the dielectric layer 145 has improved physical properties (e.g., harder, and/or having a smaller etch rate) to withstand a subsequent etching process. In some embodiments, a thickness of the dielectric layer 145 is between about 1 nm and about 10 nm. The dielectric layer 145 serves the same or similar functions as the dielectric layer 107 of FIG. 16A. Note the upper surface 145U of the dielectric layer 145 is lower (e.g., closer to the substrate 50) than a lowermost surface of the second semiconductor material 54 facing the substrate 50, which allows the subsequently formed source/drain regions 112 to electrically connect to the second semiconductor material 54 (e.g., the channel regions of the NSFETs) without being blocked by the dielectric layer 145.

Besides converting the upper layer of the treated layer 143 into the dielectric layer 145, the oxidization process may also oxidize other exposed materials (e.g., 54, 55). To clean the openings 110 in preparation for the epitaxial growth of the source/drain regions 112 (see FIGS. 19A-19B), an etching process may be performed to remove the oxides (e.g., oxide of the second semiconductor material 54 and oxide of the inner spacers 55) from, e.g., the sidewalls of the openings 110. The dielectric layer 145, with its implanted ion species, has a much lower etch rate for the etching process. Due to the etching selectivity provided by the implantation process, the etching process removes the oxides from the sidewalls of the openings 110 without substantially attacking the dielectric layer 145.

Figure 19C:
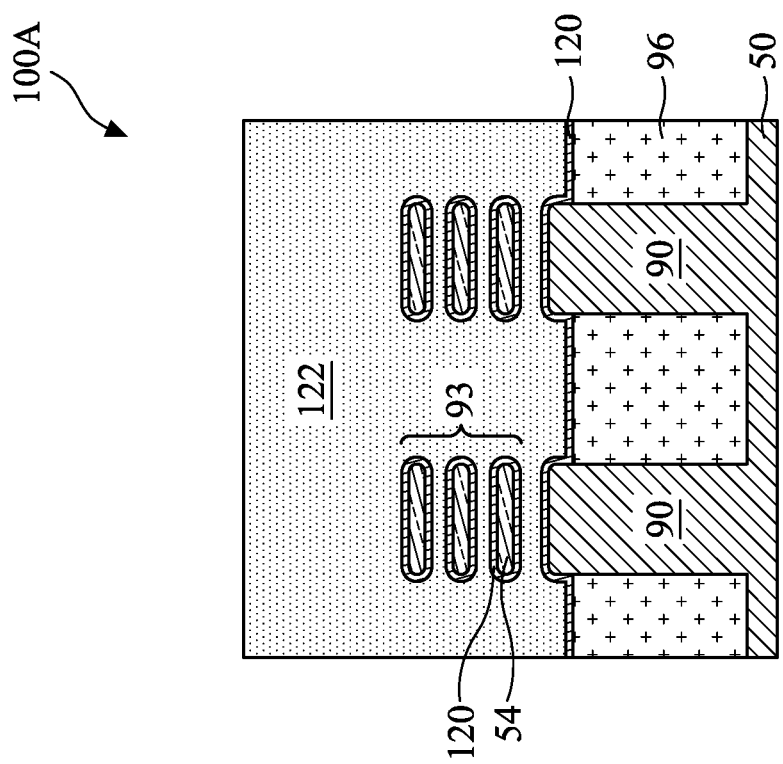

Next, in FIGS. 19A-19C, source/drain regions 112 are formed in the openings 110 on the dielectric layer 145, the dummy gates 102 are removed, the first semiconductor material 52 is removed to form nanostructures 54, and the metal gate structure (e.g., 120 and 122) are formed, following the same or similar processing steps as discussed above for the NSFET device 100, thus details are not repeated.

FIG. 19B illustrates the cross-sectional view of the NSFET device 100A along cross-section E-E' in FIG. 19A, and FIG. 19C illustrates the cross-sectional view along cross-section F-F' in FIG. 19A. As illustrated in FIG. 19B, the dielectric layer 145 physically separates, and electrically isolates, the source/drain regions 112 from the underlying fins 90 to prevent or reduce substrate leakage and/or well isolation leakage.

FIGS. 20, 21, and 22A-22C are cross-sectional views of a nanostructure field-effect transistor (NSFET) device 100B at various stages of manufacturing, in accordance with another embodiment. The processing of FIG. 20 follows the processing of FIGS. 8A-8C, in some embodiments.

Figure 20:
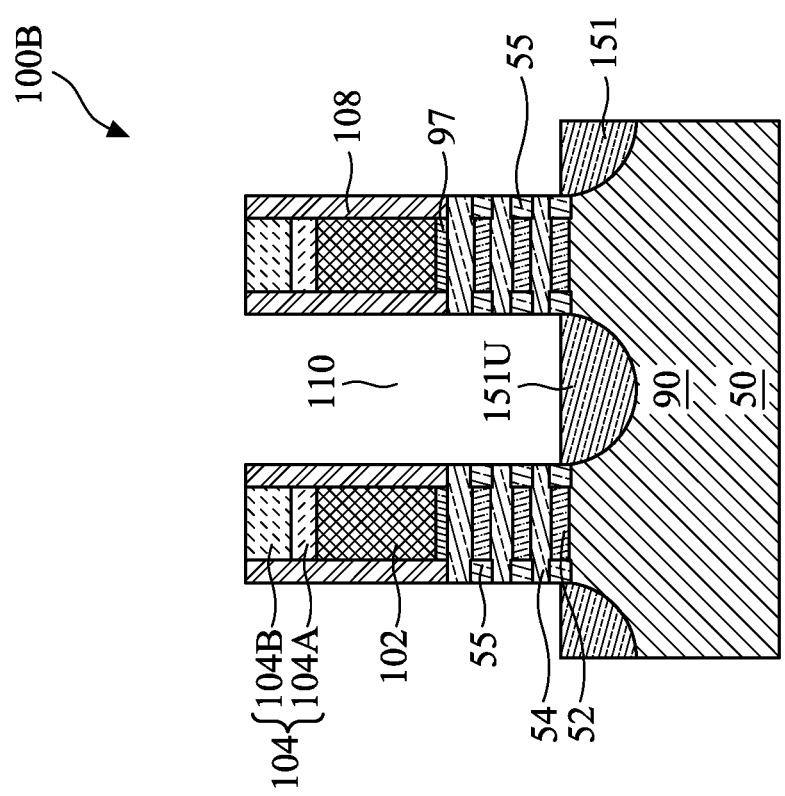
FIGS. 20, 21, 22A, 22B, and 22C are cross-sectional views of a nanostructure field-effect transistor device at various stages of manufacturing, in accordance with another embodiment.

As illustrated in FIG. 20, after the inner spacers 55 are formed in FIG. 8A, a semiconductor material 151, such as silicon germanium, is formed in the openings 110 by, e.g., an epitaxial growth process. An upper surface 151U of the semiconductor material 151 is higher (e.g., further from the substrate 50) than a lowermost surface of the inner spacers 55 facing the substrate 50. In other words, the semiconductor material 151 contacts (e.g., physically contacts) sidewalls of the lowermost inner spacers 55, and extends continuously from a first lowermost inner spacer 55 (e.g., a lowermost inner spacer 55 under the dummy gate 102 on the left of FIG. 20) to a laterally adjacent second lowermost inner spacer 55 (e.g., a lowermost inner spacer 55 under the dummy gate 102 on the right of FIG. 20).

Figure 21:
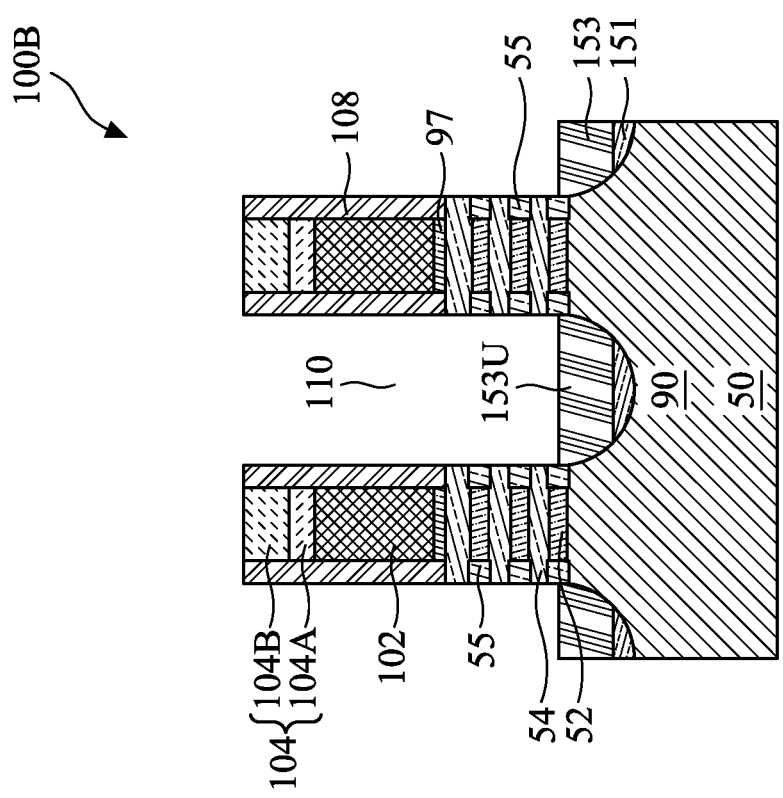

Next, in FIG. 21, an oxidization process is performed to convert an upper layer of the semiconductor material 151 into a dielectric layer 153 (e.g., an oxide of silicon germanium, or silicon germanium oxide). In an embodiment, a furnace oxidization process using a gas source comprising hydrogen ($H_2$) and oxygen ($O_2$) is performed to form the dielectric layer 153. In some embodiments, a thickness of the dielectric layer 153 is between about 1 nm and about 10 nm. The dielectric layer 153 serves the same or similar functions as the dielectric layer 107 of FIG. 16A. In some embodiments, the oxidization process converts all of the semiconductor material 151 into the dielectric layer 153, and therefore, there is no semiconductor material 151 left under the dielectric layer 153. Note that the implantation process 140 for the NSFET device 100A is not performed in this embodiment, because the oxide of the semiconductor material 151 (e.g., SiGeO) is different from, e.g., the oxide of the second semiconductor material 54 (e.g., SiO), and therefore, already provides etching selectivity for the subsequent etching process to clean the openings 110. Note that the upper surface 153U of the dielectric layer 153 is lower (e.g., closer to the substrate 50) than a lowermost surface of the second semiconductor material 54 facing the substrate 50, which allows the subsequently formed source/drain regions 112 to electrically connect to the second semiconductor material 54 (e.g., the channel regions of the NSFETs) without being blocked by the dielectric layer 153.

Figure 22B:
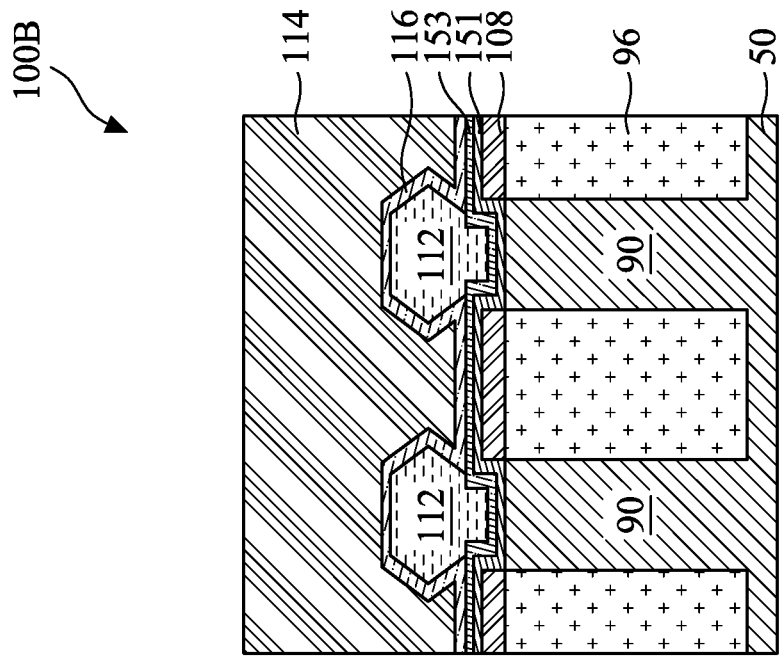
Figure 22A:
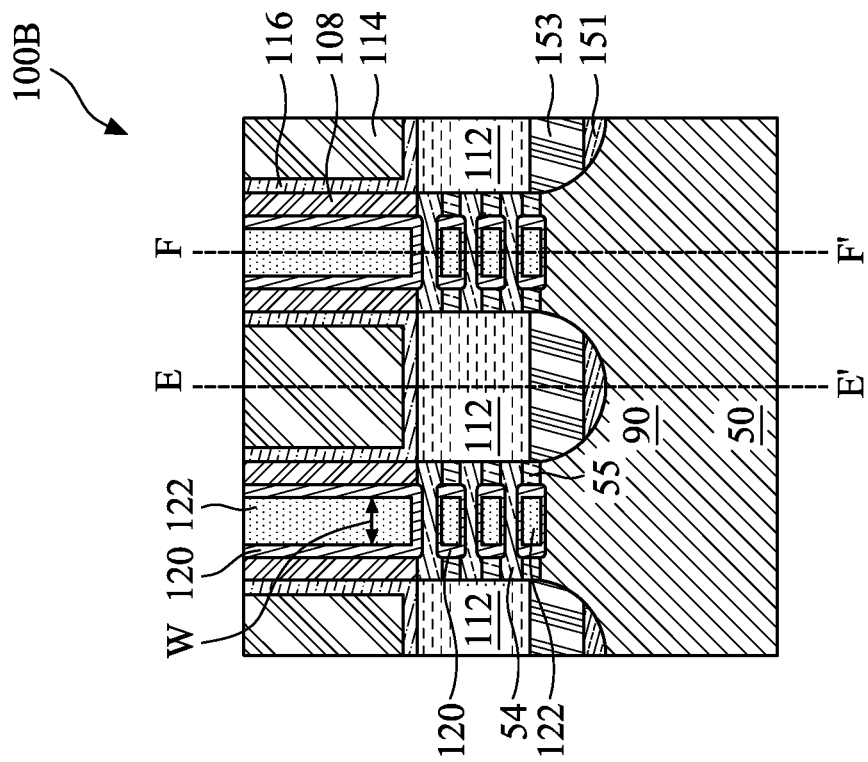
Figure 22C:
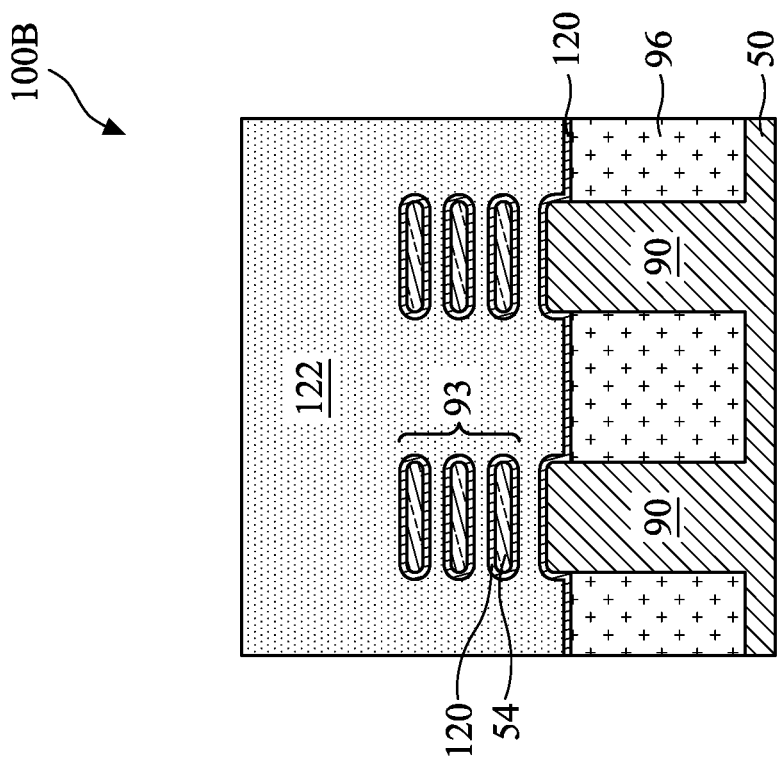

Next, in FIGS. 22A-22C, source/drain regions 112 are formed in the openings 110 on the dielectric layer 153, the dummy gates 102 are removed, the first semiconductor material 52 is removed to form nanostructures 54, and the metal gate structure (e.g., 120 and 122) are formed, following the same or similar processing steps as discussed above for the NSFET device 100, thus details are not repeated.

FIG. 22B illustrates the cross-sectional view of the NSFET device 100B along cross-section E-E' in FIG. 22A, and FIG. 22C illustrates the cross-sectional view along cross-section F-F' in FIG. 22A. As illustrated in FIG. 22B, the dielectric layer 153 physically separates, and electrically isolates, the source/drain regions 112 from the underlying fins 90 to prevent or reduce substrate leakage and/or well isolation leakage.

FIGS. 23, 24, and 25A-25C are cross-sectional views of a nanostructure field-effect transistor (NSFET) device 100C at various stages of manufacturing, in accordance with yet another embodiment. The processing of FIG. 23 follows the processing of FIGS. 7A-7C, in some embodiments.

Figure 23:
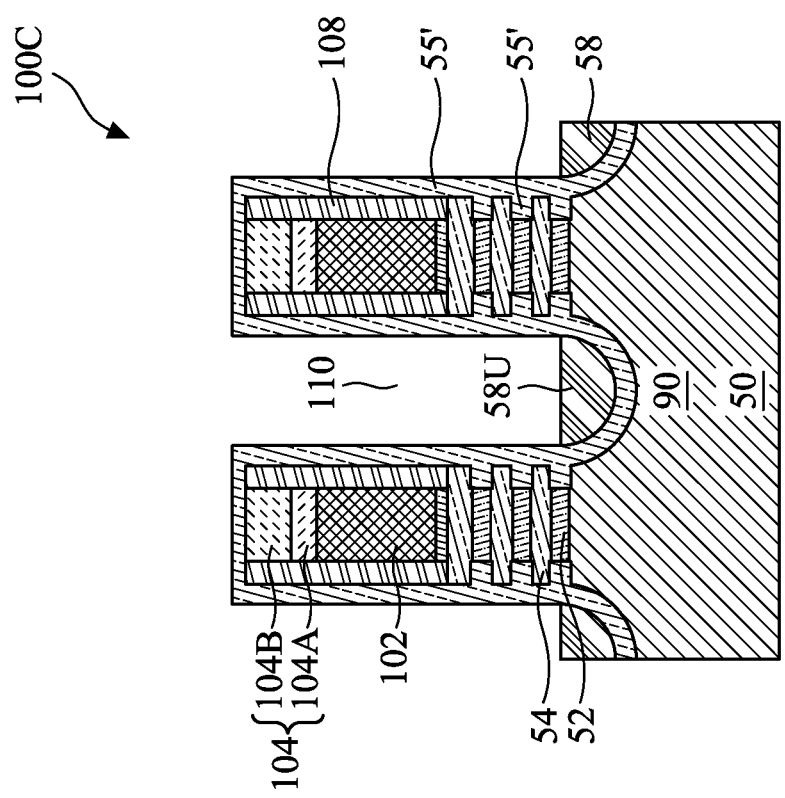
FIGS. 23, 24, 25A, 25B, and 25C are cross-sectional views of a nanostructure field-effect transistor device at various stages of manufacturing, in accordance with yet another embodiment.

As illustrated in FIG. 23, after the spacer film 55' is formed, a protection material 58 is formed at the bottoms of the openings 110 on the spacer film 55'. The protection material 58 may be, e.g., a photoresist material, a bottom anti-reflective coating (BARC), or the like. An upper surface 58U of the protection material 58 is higher (e.g., further from the substrate 50) than a lowermost surface of the inner spacers 55 facing the substrate 50. In other words, the protection material 58 contacts (e.g., physically contacts) sidewalls of the lowermost inner spacers 55.

Figure 24:
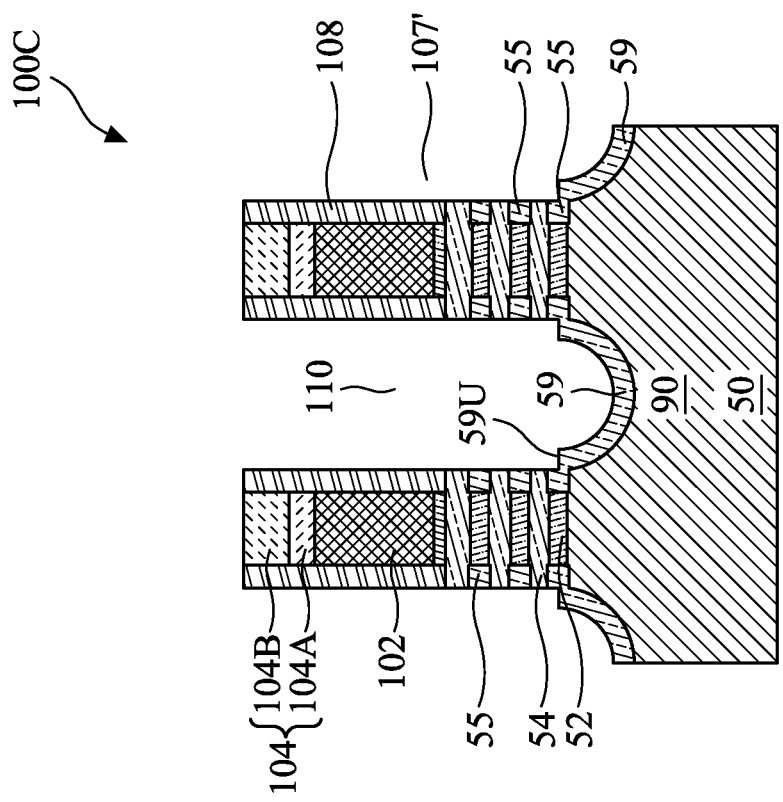

Next, in FIG. 24, a trimming process same as or similar to the trimming process of FIG. 8A is performed to remove portions of the spacer film 55' disposed outside the sidewall recesses 52R, such as portions along the sidewalls of the openings 110. Note that portions of the spacer film 55' disposed under the upper surface 58U of the protection material 58 is shielded from the trimming process, thus remain after the trimming process to form a dielectric layer 59. After the trimming process, the protection material 58 is removed by a suitable removal process, such as ashing. The shape of the dielectric layer 59 may be controlled by, e.g., varying the depth of the protection material 58 and/or the thickness of the spacer film 55', in some embodiments.

As illustrated in FIG. 24, the dielectric layer 59 contacts (e.g., physically contacts) sidewalls of the lowermost inner spacers 55, and extends continuously from a first lowermost inner spacer 55 (e.g., a lowermost inner spacer 55 under the dummy gate 102 on the left of FIG. 24) to a laterally adjacent second lowermost inner spacer 55 (e.g., a lowermost inner spacer 55 under the dummy gate 102 on the right of FIG. 24). In some embodiments, a thickness of the dielectric layer 59 is between about 1 nm and about 10 nm. In the example of FIG. 24, the dielectric layer 59 has a same material composition as the inner spacers 55 (e.g., SiN, SiCN, SiOCN). The dielectric layer 59 serves the same or similar functions as the dielectric layer 107 of FIG. 16A. Note that the upper surface 59U of the dielectric layer 59 is lower (e.g., closer to the substrate 50) than a lowermost surface of the second semiconductor material 54 facing the substrate 50, which allows the subsequently formed source/drain regions 112 to electrically connect to the second semiconductor material 54 (e.g., the channel regions of the NSFETs) without being blocked by the dielectric layer 59.

Figure 25B:
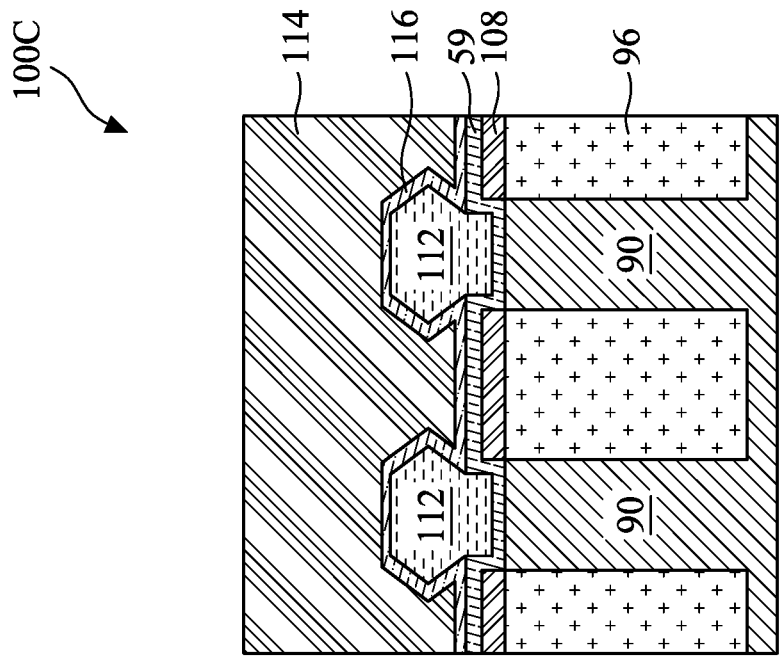
Figure 25A:
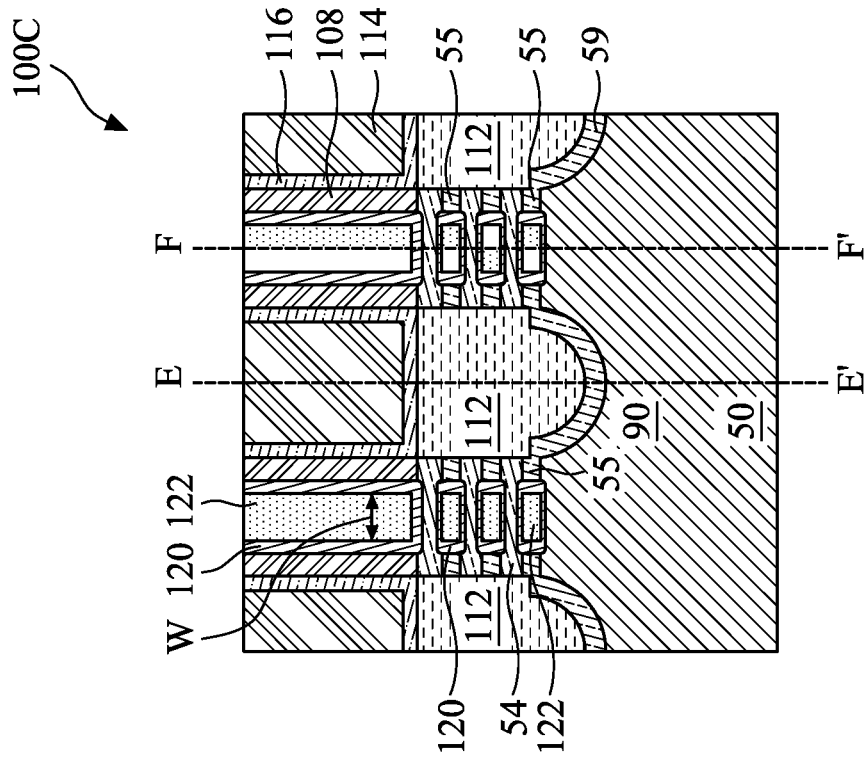
Figure 25C:
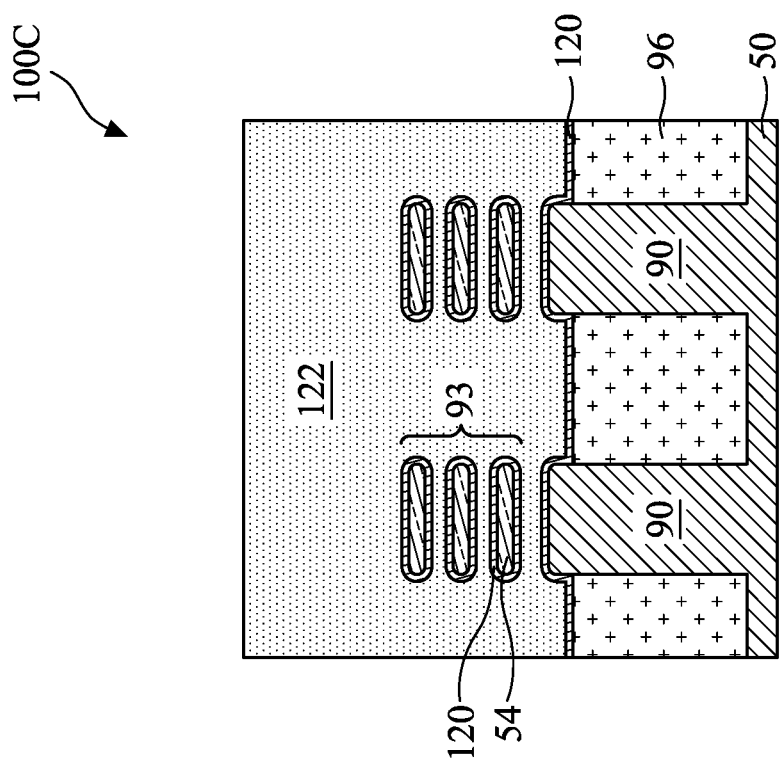

Next, in FIGS. 25A-25C, source/drain regions 112 are formed in the openings 110 on the dielectric layer 59, the dummy gates 102 are removed, the first semiconductor material 52 is removed to form nanostructures 54, and the metal gate structure (e.g., 120 and 122) are formed, following the same or similar processing steps as discussed above for the NSFET device 100, thus details are not repeated.

FIG. 25B illustrates the cross-sectional view of the NSFET device 100C along cross-section E-E' in FIG. 25A, and FIG. 25C illustrates the cross-sectional view along cross-section F-F' in FIG. 25A. As illustrated in FIG. 25B, the dielectric layer 59 physically separates, and electrically isolates, the source/drain regions 112 from the underlying fins 90 to prevent or reduce substrate leakage and/or well isolation leakage.

Figure 26:
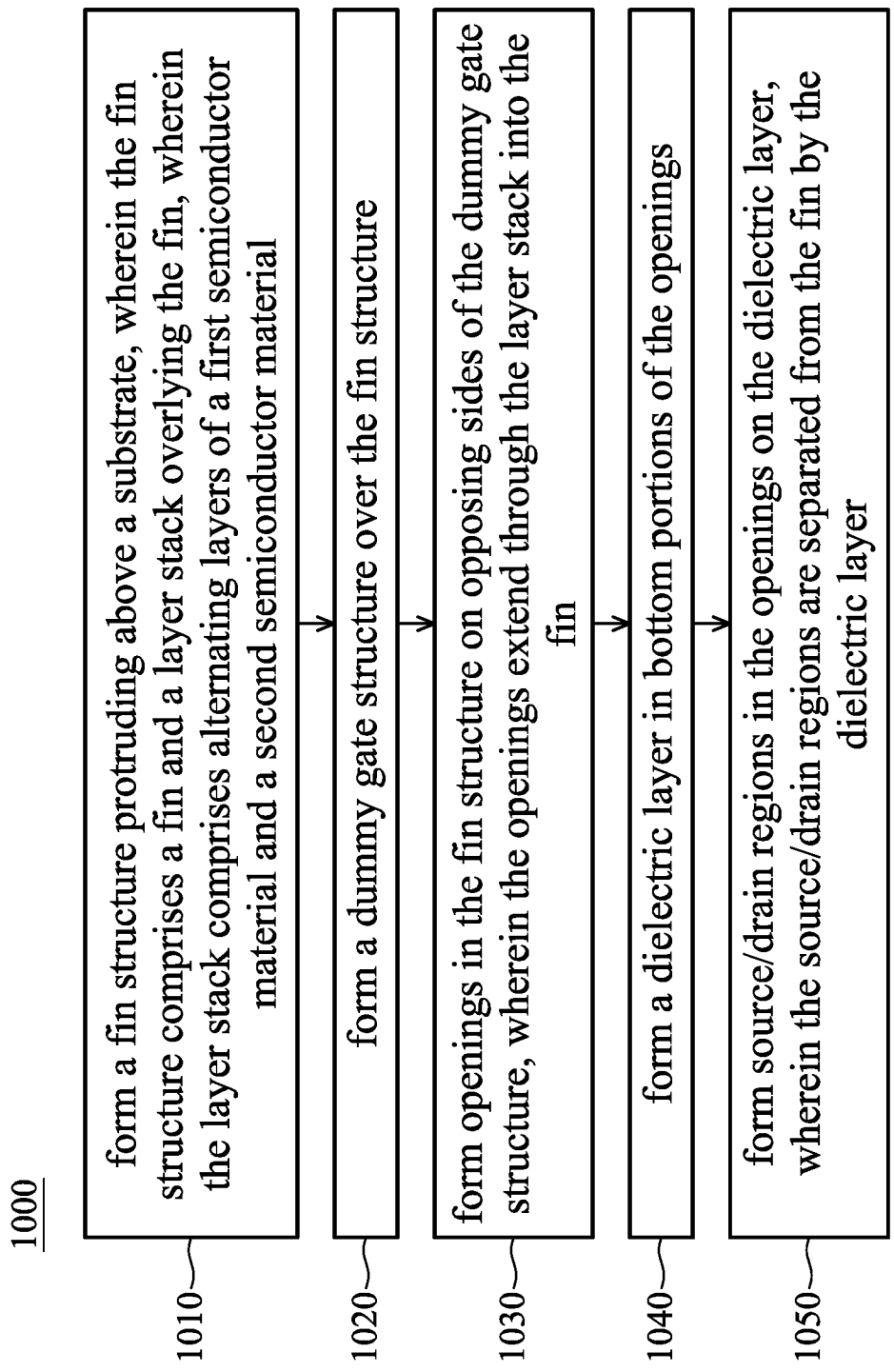
FIG. 26 is a flow chart of a method of forming a semiconductor device, in some embodiments.

FIG. 26 illustrates a flow chart of a method of fabricating a semiconductor device, in accordance with some embodiments. It should be understood that the embodiment method shown in FIG. 26 is merely an example of many possible embodiment methods. One of ordinary skill in the art would recognize many variations, alternatives, and modifications. For example, various steps as illustrated in FIG. 26 may be added, removed, replaced, rearranged, or repeated.

Referring to FIG. 26, at block 1010, a fin structure is formed protruding above a substrate, wherein the fin structure comprises a fin and a layer stack overlying the fin, wherein the layer stack comprises alternating layers of a first semiconductor material and a second semiconductor material. At block 1020, a dummy gate structure is formed over the fin structure. At block 1030, openings are formed in the fin structure on opposing sides of the dummy gate structure, wherein the openings extend through the layer stack into the fin. At block 1040, a dielectric layer is formed in bottom portions of the openings. At block 1050, source/drain regions are formed in the openings on the dielectric layer, wherein the source/drain regions are separated from the fin by the dielectric layer.

Embodiments may achieve advantages. For example, by forming the dielectric layer under the source/drain regions 112 of short channel regions in the n-type device region, substrate leakage and well isolation leakage are reduced or prevented, and device performance is improved. By not forming the dielectric layer under the source/drain regions 113 of the p-type device region, high-quality epitaxial source/drain regions are grown on the fin to exert stress on the channel regions of the p-type NSFETs. In addition, by not forming the dielectric layer under the source/drain regions 112 of long channel region in the n-type device region, large volumes of the epitaxial source/drain regions are grown on the fin to fill the source/drain openings. Furthermore, the dielectric layer is not formed in pick-up regions to allow for easy access to the substrate voltage. The presently disclosed embodiments achieve advantages (e.g., reducing substrate leakage and well isolation leakage) for NSFETs in short channel regions of the n-type device regions while avoiding issues the dielectric layer may cause in other device regions.

In accordance with an embodiment, a method of forming a semiconductor device includes: forming a fin structure protruding above a substrate, where the fin structure comprises a fin and a layer stack overlying the fin, where the layer stack comprises alternating layers of a first semiconductor material and a second semiconductor material; forming a dummy gate structure over the fin structure; forming openings in the fin structure on opposing sides of the dummy gate structure, where the openings extend through the layer stack into the fin; forming a dielectric layer in bottom portions of the openings; and forming source/drain regions in the openings on the dielectric layer, where the source/drain regions are separated from the fin by the dielectric layer. In an embodiment, a bottom surface of the source/drain regions facing the substrate contacts and extends along an upper surface of the dielectric layer facing away from the substrate. In an embodiment, the first semiconductor material in the layer stack contacts the fin, wherein the upper surface of the dielectric layer is closer to the substrate than a lowermost surface of the second semiconductor material facing the substrate. In an embodiment, forming the dielectric layer comprises: lining sidewalls and bottoms of the openings with a dielectric material; performing an implantation process to treat the dielectric material; and after the implantation process, performing an etching process to remove sidewall portions of the dielectric material, wherein after the etching process, bottom portions of the dielectric material remain and form the dielectric layer. In an embodiment, after the implantation process, a first concentration of an ion species in the bottom portions of the dielectric material is higher than a second concentration of the ion species in the sidewall portions of the dielectric material. In an embodiment, forming the dielectric layer comprises: epitaxially growing a semiconductor material in the bottom portions of the openings; and performing an oxidization process to convert an upper layer of the semiconductor material into an oxide of the semiconductor material, wherein the oxide of the semiconductor material forms the dielectric layer. In an embodiment, the method further includes, after epitaxially growing the semiconductor material and before performing the oxidization process, performing an implantation process to treat the semiconductor material. In an embodiment, forming the dielectric layer comprises: lining sidewalls and bottoms of the openings with a dielectric material; after the lining, forming a protection material in the bottom portions of the openings on the dielectric material; and after forming the protection material, performing an etching process to remove an upper portion of the dielectric material from over an upper surface of the protection material, wherein after the etching process, a lower portion of the dielectric material below the upper surface of the protection material remains to form the dielectric layer. In an embodiment, the method further includes: before the lining, removing end portions of the first semiconductor material exposed by the openings to form sidewall recesses, wherein after lining sidewalls and bottoms of the openings with the dielectric material, the dielectric material fills the sidewall recesses, wherein after the etching process, the dielectric material inside the sidewall recesses remains and forms inner spacers. In an embodiment, the method further includes, after forming the source/drain regions: forming an inter-layer dielectric (ILD) layer over the source/drain regions around the dummy gate structure; removing the dummy gate structure to expose the first semiconductor material and the second semiconductor material under the dummy gate structure; and performing an etching process to selectively remove the exposed first semiconductor material, wherein after the etching process, the exposed second semiconductor material form nanostructures. In an embodiment, the nanostructures are nanowires or nanosheets. In an embodiment, the method further includes, after the nanostructures are formed: forming a gate dielectric material around the nanostructures; and forming an electrically conductive material around the gate dielectric material.

In accordance with an embodiment, a method of forming a semiconductor device includes: forming a first gate structure and a second gate structure over a first fin structure, wherein the first fin structure comprises a fin protruding above a substrate and comprises a layer stack over the fin, wherein the layer stack comprises alternating layers of a first semiconductor material and a second semiconductor material; forming a first opening in the first fin structure between the first gate structure and the second gate structure, wherein the first opening extends through the layer stack into the fin; replacing end portions of the first semiconductor material exposed by the first opening with inner spacers; forming a dielectric layer along a bottom of the first opening, wherein the dielectric layer extends continuously from a first inner spacer under the first gate structure to a second inner spacer under the second gate structure; and forming a first source/drain region in the first opening on the dielectric layer. In an embodiment, the first inner spacer is a first lowermost inner spacer under the first gate structure, and the second inner spacer is a second lowermost inner spacer under the second gate structure. In an embodiment, after forming the dielectric layer, sidewalls of the second semiconductor material facing the first opening are free of the dielectric layer. In an embodiment, the first fin structure is in an n-type device region of the semiconductor device, wherein the first gate structure, the second gate structure, the first opening, and the first source/drain region are formed in a first region of the n-type device region, wherein the first source/drain region comprises an n-type dopant, wherein the method further comprises: forming, in a second region of the n-type device region, a third gate structure and a fourth gate structure over the first fin structure; forming a second opening in the first fin structure between the third gate structure and the fourth gate structure, wherein the second opening extends through the layer stack into the fin; and forming a second source/drain region in the second opening, wherein the second source/drain region comprises a p-type dopant and physically contacts the fin. In an embodiment, the first fin structure is in an n-type device region of the semiconductor device, wherein the first source/drain region comprises an n-type dopant, wherein the method further comprises: forming a third gate structure and a fourth gate structure over a second fin structure, wherein the second fin structure is in a p-type device region of the semiconductor device, wherein the second fin structure comprises a second fin protruding above the substrate and comprises the layer stack over the second fin; forming a second opening in the second fin structure between the third gate structure and the fourth gate structure, wherein the second opening extends through the layer stack into the second fin; and forming a second source/drain region in the second opening, wherein the second source/drain region comprises a p-type dopant and physically contacts the second fin.

In accordance with an embodiment, a semiconductor device includes: a fin protruding above a substrate; a gate structure over the fin; source/drain regions over the fin on opposing sides of the gate structure, wherein the source/drain regions extend into the fin; a dielectric layer under the source/drain regions, wherein the dielectric layer is disposed between, and separates, the source/drain region and the fin; and channel layers under the gate structure and between the source/drain regions, wherein the channel layers are parallel to each other, wherein opposing ends of each of the channel layers contact the source/drain regions. In an embodiment, a bottom surface of the source/drain regions facing the substrate contacts and extends along an upper surface of the dielectric layer facing away from the substrate. In an embodiment, the upper surface of the dielectric layer is closer to the substrate than a lowermost surface of the channel layers facing the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a fin structure protruding above a substrate, wherein the fin structure comprises a fin and a layer stack overlying the fin, wherein the layer stack comprises alternating layers of a first semiconductor material and a second semiconductor material;
    forming a gate structure over the fin structure;
    forming openings in the fin structure on opposing sides of the gate structure, wherein the openings extend through the layer stack into the fin;
    forming a dielectric layer in bottoms of the openings, comprising:
        lining sidewalls of the openings and the bottoms of the openings with a dielectric material;
        performing an implantation process to treat the dielectric material; and
        after performing the implantation process, performing an etching process to remove first portions of the dielectric material disposed along the sidewalls of the openings, wherein after the etching process, second portions of the dielectric material at the bottoms of the openings remain to form the dielectric layer; and
    forming source/drain regions in the openings on the dielectric layer, wherein the source/drain regions are separated from the fin by the dielectric layer.

2. The method of claim 1, wherein a lowermost layer of the first semiconductor material in the layer stack contacts the fin, wherein an upper surface of the dielectric layer distal from the substrate is closer to the substrate than a lower surface of a lowermost layer of the second semiconductor material facing the substrate.

3. The method of claim 1, wherein performing the implantation process reduces an etch rate of the dielectric material.

4. The method of claim 1, wherein the implantation process is performed using a gas source comprising carbon (C), oxygen (O), germanium (Ge), or combinations thereof.

5. The method of claim 4, wherein performing the implantation process implants an ion species of the gas source into the dielectric material, wherein after the implantation process, a second concentration of the ion species in the second portions of the dielectric material is higher than a first concentration of the ion species in the first portions of the dielectric material.

6. The method of claim 5, where after the implantation process, a concentration of the ion species in the dielectric material decreases gradually along a direction from the second portions of the dielectric material toward the first portions of the dielectric material.

7. The method of claim 1, where the dielectric material is formed to have a thickness between about 1 nm and about 10 nm.

8. The method of claim 1, wherein the etching process removes the dielectric material disposed at the bottoms of the openings at a faster rate than the dielectric material disposed along the sidewalls of the openings.

9. The method of claim 1, wherein a bottom surface of the source/drain regions facing the substrate contacts and extends along an upper surface of the dielectric layer facing away from the substrate.

10. The method of claim 1, further comprising, after forming the source/drain regions:
- forming an inter-layer dielectric (ILD) layer over the source/drain regions around the gate structure;
- removing the gate structure, wherein portions of the first semiconductor material and portions of the second semiconductor material under the gate structure are exposed after removing the gate structure; and
- performing another etching process to selectively remove the exposed portions of the first semiconductor material, wherein after the another etching process, the exposed portions of the second semiconductor material form nanostructures.

11. The method of claim 10, further comprising, after the nanostructures are formed:
- forming a gate dielectric material around the nanostructures; and
- forming a gate electrode material around the gate dielectric material.

12. A method of forming a semiconductor device, the method comprising:
- forming a first gate structure and a second gate structure over a fin structure, wherein the fin structure comprises a fin protruding above a substrate and comprises a layer stack over the fin, wherein the layer stack comprises alternating layers of a first semiconductor material and a second semiconductor material;
- forming an opening in the fin structure between the first gate structure and the second gate structure, wherein the opening extends through the layer stack into the fin;
- replacing end portions of the first semiconductor material exposed by the opening with inner spacers;
- forming a dielectric layer along a bottom of the opening, comprising:
  - forming a third semiconductor material at a bottom of the opening; and
  - converting an upper layer of the third semiconductor material into an oxide of the third semiconductor material; and
- forming a first source/drain region in the opening on the dielectric layer.

13. The method of claim 12, wherein the dielectric layer is formed to extend continuously from a first inner spacer under the first gate structure to a second inner spacer under the second gate structure.

14. The method of claim 13, wherein the first inner spacer is a first lowermost inner spacer under the first gate structure, and the second inner spacer is a second lowermost inner spacer under the second gate structure.

15. The method of claim 12, wherein after forming the dielectric layer, sidewalls of the second semiconductor material facing the opening are free of the dielectric layer.

16. The method of claim 12, where the converting comprises performing an oxidization process to convert the upper layer of the third semiconductor material into the oxide of the third semiconductor material.

17. The method of claim 16, further comprising, after the forming the third semiconductor material and before the converting, performing an implantation process to treat the third semiconductor material.

18. A semiconductor device comprising:
- a fin protruding above a substrate;
- a gate structure over the fin;
- source/drain regions over the fin on opposing sides of the gate structure, wherein the source/drain regions extend into the fin;
- a dielectric structure under the source/drain regions, wherein the dielectric structure is disposed between, and separates, the source/drain region and the fin, wherein the dielectric structure comprises:
  - a first layer of material contacting the fin; and
  - a second layer of material over the first layer of material, wherein the second layer of material is an oxide of the first layer of material; and
- channel layers under the gate structure and between the source/drain regions, wherein the channel layers are parallel to each other, wherein opposing ends of each of the channel layers contact the source/drain regions.

19. The semiconductor device of claim 18, wherein an upper surface of the dielectric structure distal from the substrate is closer to the substrate than a lowermost surface of the channel layers facing the substrate.

20. The semiconductor device of claim 18, wherein the dielectric structure further comprises a third layer of material between the first layer of material and the second layer of material, wherein the first layer of material is a semiconductor material, and the third layer of material is the semiconductor material doped with ion species of fluoride (F), germanium (Ge), oxygen (O), or argon (Ar).

* * * * *